(12) United States Patent
Kalnitsky et al.

(10) Patent No.: US 9,437,494 B2
(45) Date of Patent: Sep. 6, 2016

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Alexander Kalnitsky, San Francisco, CA (US); Kong-Beng Thei, Pao-Shan Village (TW); Chien-Chih Chou, New Taipei (TW); Chen-Liang Chu, Hsin-Chu (TW); Hsiao-Chin Tuan, juDong County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 174 days.

(21) Appl. No.: 14/184,900

(22) Filed: Feb. 20, 2014

(65) Prior Publication Data
US 2014/0273376 A1 Sep. 18, 2014

Related U.S. Application Data

(60) Provisional application No. 61/800,767, filed on Mar. 15, 2013.

(51) Int. Cl.
*H01L 21/8234* (2006.01)
*H01L 21/8238* (2006.01)
(Continued)

(52) U.S. Cl.
CPC . *H01L 21/823418* (2013.01); *H01L 21/26586* (2013.01); *H01L 21/823412* (2013.01); *H01L 21/823462* (2013.01);
(Continued)

(58) Field of Classification Search
USPC ............... 257/208, 315, 347, 369, 404, 500; 438/153, 199, 229, 289, 302, 527, 275
See application file for complete search history.

(56) References Cited

U.S. PATENT DOCUMENTS

| 6,448,160 B1 * | 9/2002 | Chang ................. H01L 21/2815 257/E21.418 |
| 2002/0008278 A1 * | 1/2002 | Mori ................. H01L 21/82345 257/315 |

(Continued)

FOREIGN PATENT DOCUMENTS

CN 1366710 8/2002

OTHER PUBLICATIONS

Corresponding Chinese Application 201410095738.0, Chinese Office action dated Apr. 28, 2016, 7 pages.

*Primary Examiner* — Errol Fernandes
(74) *Attorney, Agent, or Firm* — Cooper Legal Group, LLC

(57) ABSTRACT

A semiconductor arrangement and method of formation are provided. A method of semiconductor formation includes using a single photoresist to mask off an area where low voltage devices are to be formed as well as gate structures of high voltage devices while performing high energy implants for the high voltage devices. Another method of semiconductor fabrication includes performing high energy implants for high voltage devices through a patterned photoresist where the photoresist is patterned prior to forming gate structures for high voltage devices and prior to forming gate structures for low voltage devices. After the high energy implants are performed, subsequent processing is performed to form high voltage devices and low voltage devices. High voltage device and low voltage devices are thus formed in a CMOS process without need for additional masks.

20 Claims, 21 Drawing Sheets

(51) Int. Cl.
*H01L 21/265* (2006.01)
*H01L 29/66* (2006.01)
*H01L 29/10* (2006.01)

(52) U.S. Cl.
CPC ............... *H01L 21/823807* (2013.01); *H01L 21/823814* (2013.01); *H01L 21/823857* (2013.01); *H01L 29/6659* (2013.01); *H01L 29/1083* (2013.01)

(56) References Cited

U.S. PATENT DOCUMENTS

2002/0164858 A1* 11/2002 Sayama .......... H01L 21/823807
 438/289
2004/0241919 A1* 12/2004 Chang ................ H01L 27/1214
 438/153

* cited by examiner

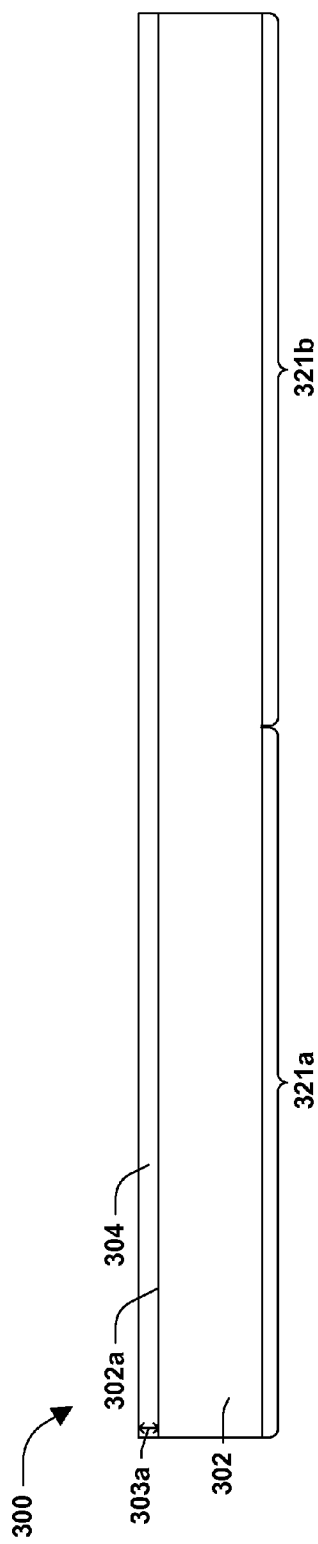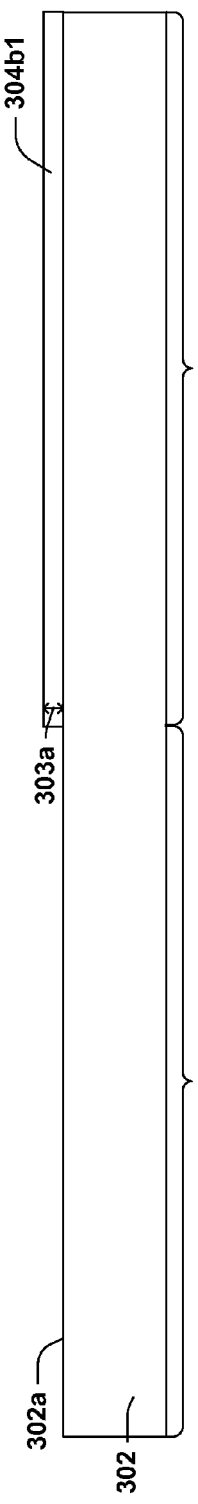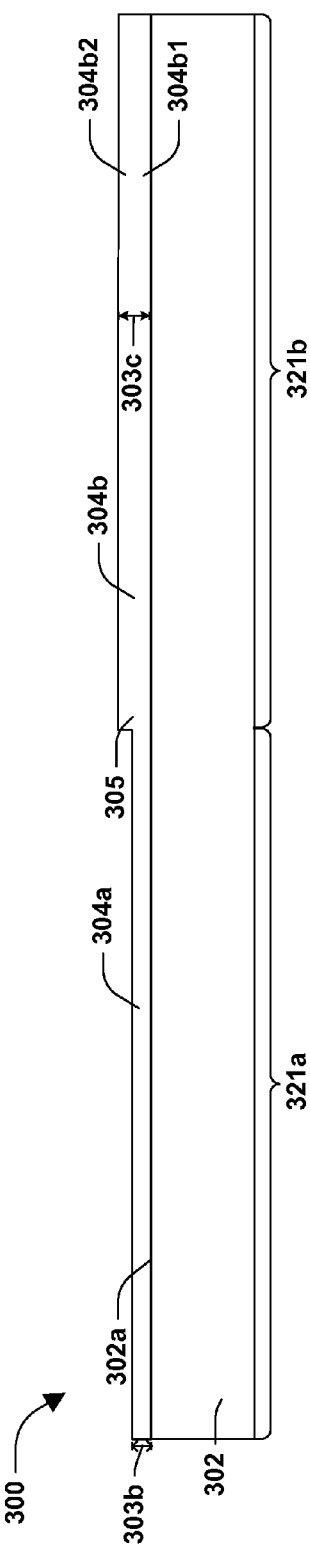

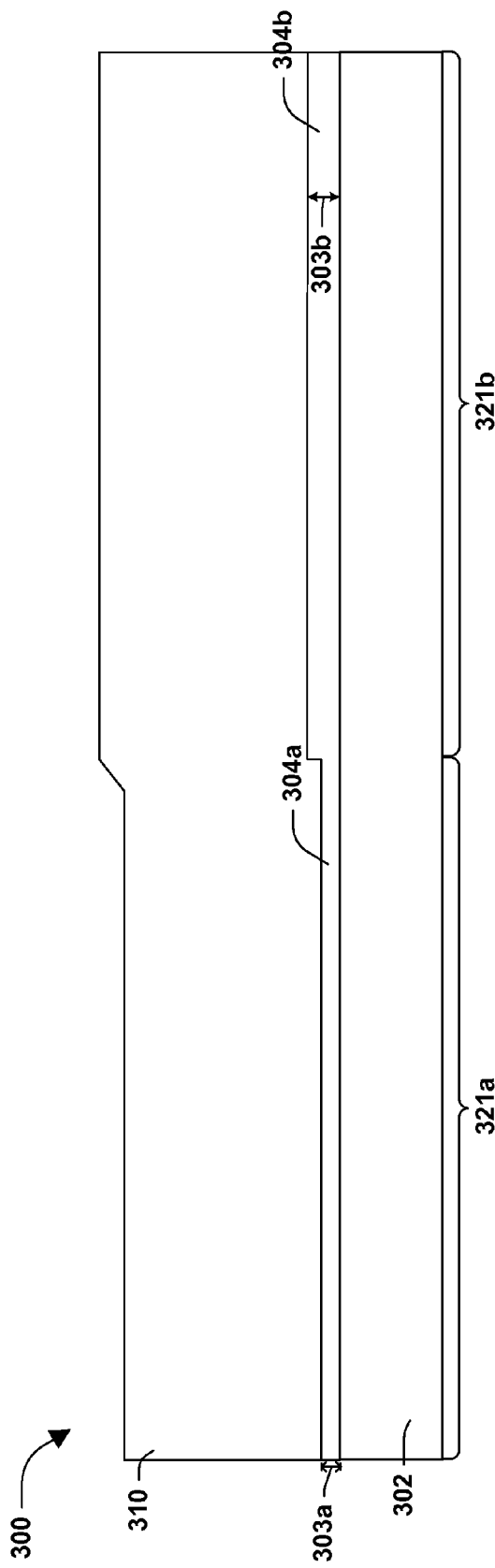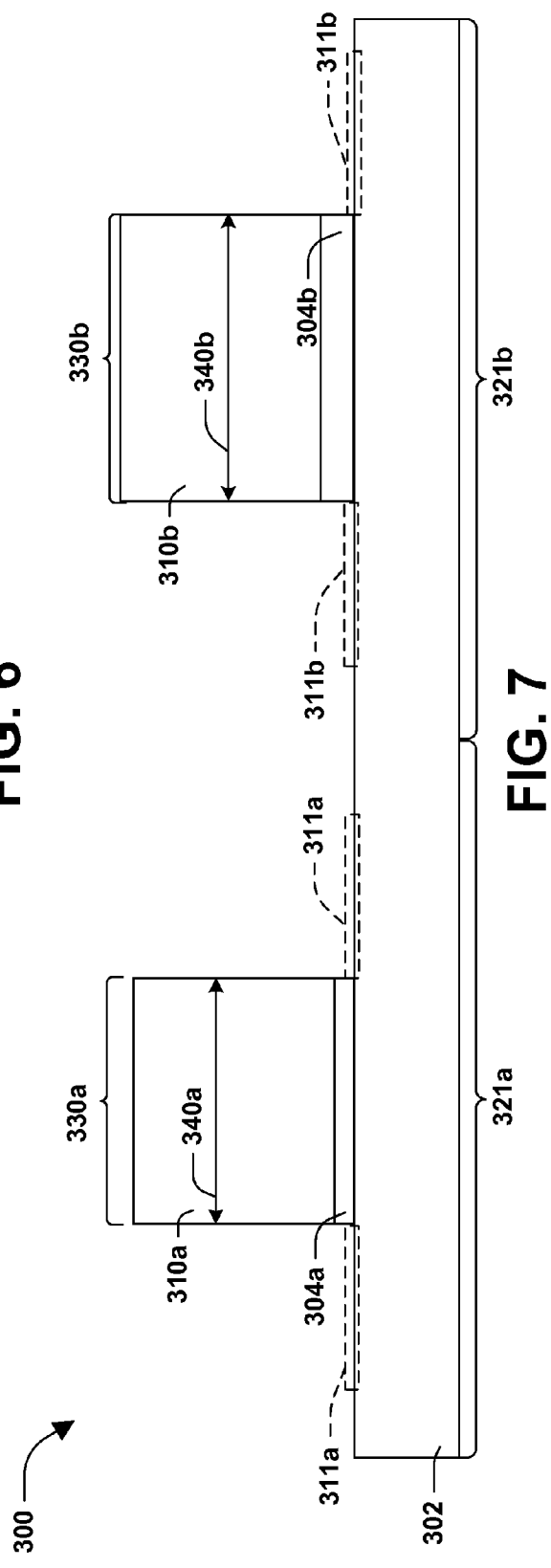

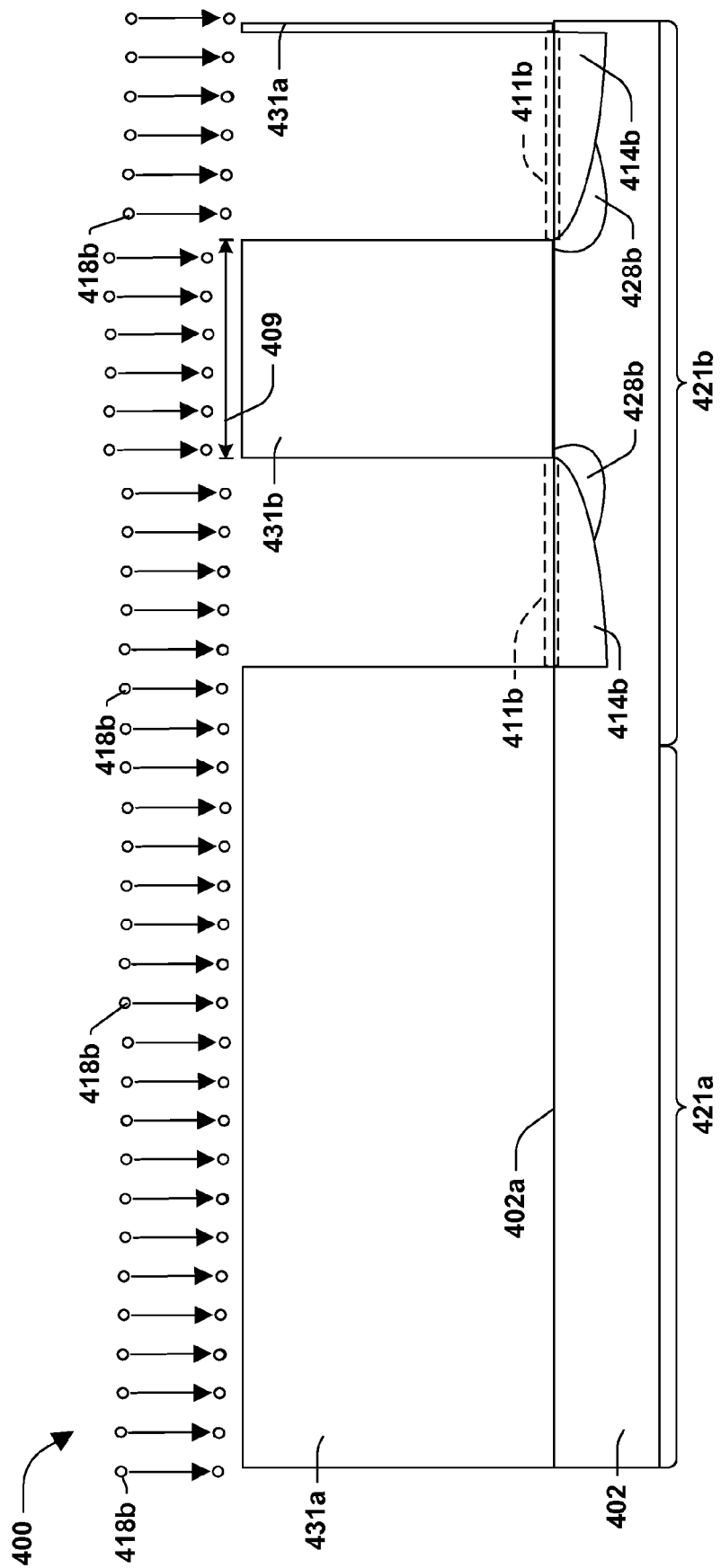

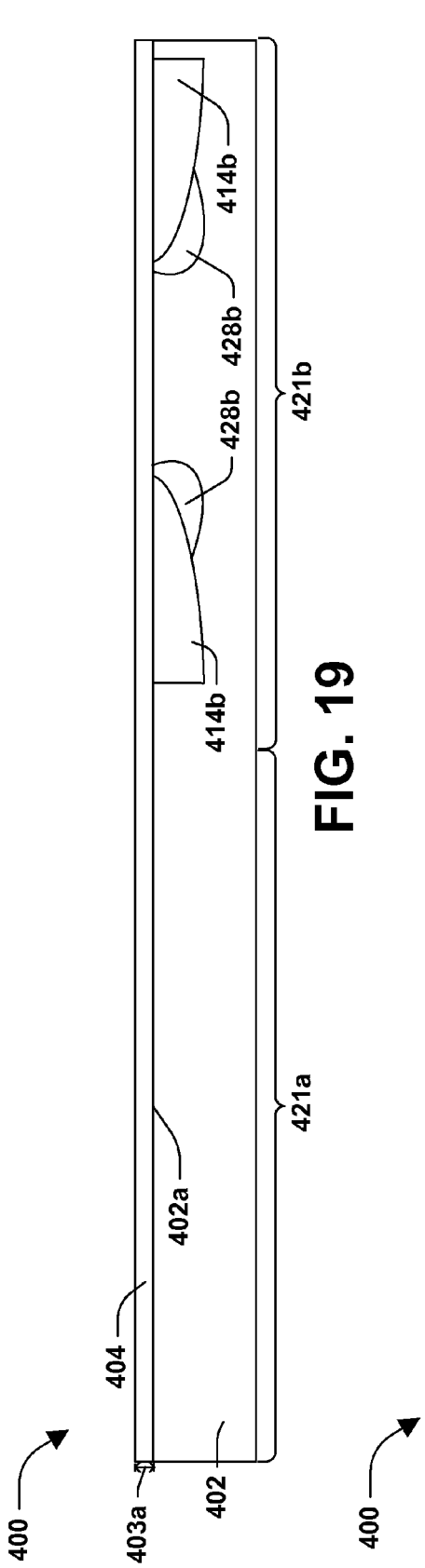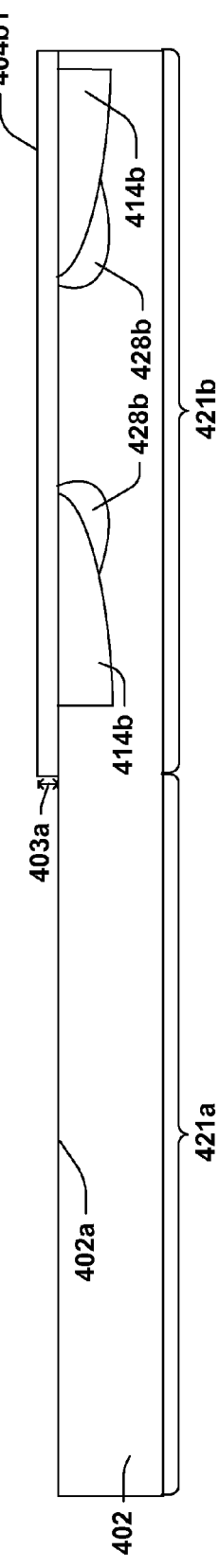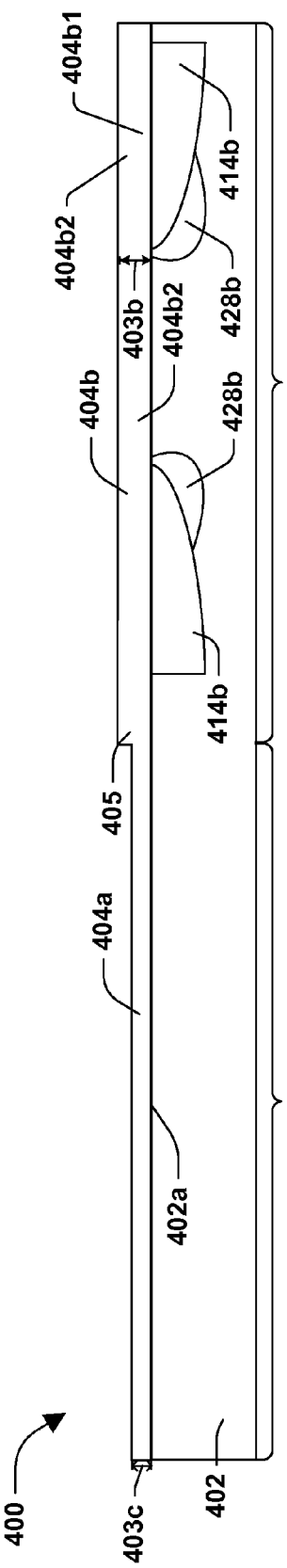

US 9,437,494 B2

SEMICONDUCTOR ARRANGEMENT AND FORMATION THEREOF

BACKGROUND

In a semiconductor device, such as a transistor, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is an illustration of a semiconductor arrangement, in accordance with some embodiments.

FIG. 4 is an illustration of a semiconductor arrangement, in accordance with some embodiments.

FIG. 5 is an illustration of a semiconductor arrangement, in accordance with some embodiments.

FIG. 6 is an illustration of a semiconductor arrangement, in accordance with some embodiments.

FIG. 7 is an illustration of a semiconductor arrangement, in accordance with some embodiments.

FIG. 18 is an illustration of a semiconductor arrangement, in accordance with some embodiments.

FIG. 19 is an illustration of a semiconductor arrangement, in accordance with some embodiments.

FIG. 20 is an illustration of a semiconductor arrangement, in accordance with some embodiments.

FIG. 21 is an illustration of a semiconductor arrangement, in accordance with some embodiments.

DETAILED DESCRIPTION

Figure 1:
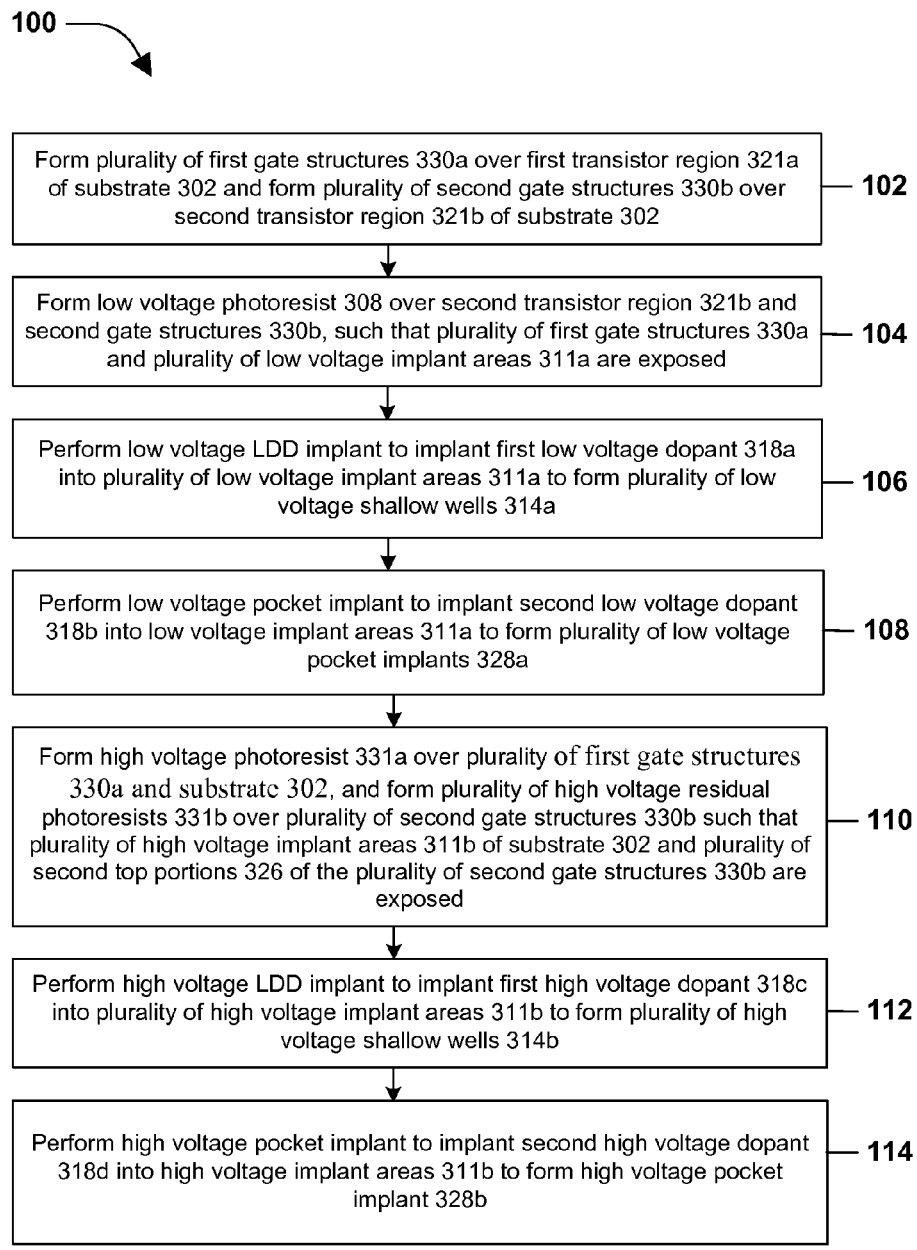
FIG. 1 is a flow diagram illustrating a method of semiconductor fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

A first method 100 of semiconductor fabrication according to some embodiments is illustrated in FIG. 1, and one or more structures formed thereby at various stages of fabrication are illustrated in FIGS. 3-15. According to some embodiments, such as illustrated in FIG. 15, a semiconductor arrangement 300 comprises a plurality of first transistors 332a having a first operating voltage in a first transistor region 321a adjacent a plurality of second transistors 332b having a second operating voltage greater than the first operating voltage, the plurality of second transistors 332b in a second transistor region 321b over a substrate 302. It will be appreciated that many transistors and features, elements, etc. thereof are formed in different regions described herein, and that merely single instances of the same are illustrated in the Figs. for simplicity. Line 399 illustrates that first transistors 332a are generally electrically isolated or decoupled from second transistors 332b. In some embodiments, the plurality of first transistors 332a comprises a plurality of first gate structures 330a and a plurality of first sidewall spacers 309a adjacent the plurality of first gate structures 330a. In some embodiments, a plurality of first source drain regions 344a are in the substrate 302 adjacent the plurality of first gate structures 330a. In some embodiments, a plurality of low voltage pocket implants 328a are adjacent the plurality of first source drain regions 344a, such that the plurality of low voltage pocket implants 328a extend farther under the plurality of first gate structures 330a than the plurality of first source drain regions 344a. In some embodiments, the plurality of second transistors 332b comprises a plurality of second gate structures 330b and a plurality of second sidewall spacers 309b adjacent the plurality of second gate structures 330b. In some embodiments, a plurality of second source drain regions 344b are in the substrate 302 adjacent the plurality of second gate structures 330b. In some embodiments, a plurality of high voltage pocket implants 328b are adjacent the plurality of second source drain regions 344b, such that the plurality of high voltage pocket implants 328b extend farther under the plurality of second gate structures 330b than the plurality of second source drain regions 344b. In some embodiments, the plurality of first transistors 332a comprises at least one of a low voltage device or a medium voltage device. In some embodiments, the plurality of second transistors 332b comprises at least one of the medium voltage device or a high voltage device. In some embodiments, the plurality of first transistors 332a are a different type, such as a different device voltage type than the plurality of second transistors 332b. In some embodiments, the low voltage device has an operating voltage of less than about 1.5V. In some embodiments, the medium voltage device has an operating voltage between about 3.3V to about 10V. In some embodiments, the high voltage device has an operating voltage above about 30V. In some embodiments, the semiconductor arrangement 300 formed according to the first method 100 has a thinner gate electrode than an arrangement not formed according to the first method 100. In some embodiments, the plurality of first transistors 332a and the plurality of second transistors 332b are formed as part of a single CMOS fabrication process without need for additional masks.

At 102 in method 100, the plurality of first gate structures 330a are formed over the first transistor region 321a of the substrate 302 and the plurality of second gate structures 330b are formed over the second transistor region 321b of the substrate 302, as illustrated in FIG. 7, according to some embodiments. Turning to FIG. 3, prior to FIG. 7, a first layer of gate dielectric material 304 is formed over a top surface 302a of the substrate 302, according to some embodiments. In some embodiments, the substrate 302 comprises at least one of silicon or germanium. According to some embodiments, the substrate 302 comprises at least one of an epitaxial layer, a silicon-on-insulator (SOI) structure, a wafer, or a die formed from a wafer. In some embodiments, the first layer of gate dielectric material 304 comprises at least one of an oxide or a nitride. In some embodiments, the first layer of gate dielectric material 304 has a first thickness 303a between about 10 Å to about 1000 Å. In some embodiments, the first layer of gate dielectric material 304 is removed, such as by etching, from the top surface 302a of the substrate 302 over the first transistor region 321a, such that a first portion 304b1 of a high voltage gate dielectric 304b remains over the second transistor region 321b of the substrate 302, as illustrated in FIG. 4. In some embodiments, a second layer of gate dielectric material 305 is formed over the top surface 302a of the substrate 302 and over the first portion 304b1 of the high voltage gate dielectric 304b, such that a low voltage gate dielectric 304a remains over the first transistor region 231a of the substrate 302 and the high voltage gate dielectric 304b remains over the second transistor region 321b of the substrate 302, as illustrated in FIG. 5. In some embodiments, the second layer of gate dielectric material 305 comprises at least one of an oxide or a nitride. In some embodiments, the second layer of gate dielectric material 305 has a second thickness 303b between about 10 Å to about 500 Å, such that the low voltage gate dielectric 304a has the second thickness 303b. In some embodiments, the high voltage gate dielectric 304b comprises the first portion 304b1 and a second portion 304b2 from the second layer of gate dielectric material 305. In some embodiments, the high voltage gate dielectric 304b has a third thickness 303c between about 20 Å to about 1200 Å, where the third thickness 303c is generally equal to a sum of the first thickness 303a and the second thickness 303b. In some embodiments, a layer of gate electrode material 310 is formed over the low voltage gate dielectric 304a and the high voltage gate dielectric 304b, as illustrated in FIG. 6. In some embodiments, the layer of gate electrode material 310 has a substantially uniform thickness. In some embodiments, the layer of gate electrode material 310 comprises at least one of a polysilicon or a metal. In some embodiments, the layer of gate electrode material 310, the low voltage gate dielectric 304a and the high voltage gate dielectric 304b are patterned to concurrently form the plurality of first gate structures 330a in the first transistor region 321a and the plurality of second gate structures 330b in the second transistor region 321b, as illustrated in FIG. 7. In some embodiments, respective gate structures of the plurality of first gate structures 330a have a first width 340a and respective gate structures of the plurality of second gate structures 330b have a second width 340b. In some embodiments, the second width 340b is greater than the first width 340a. In some embodiments, a plurality of low voltage implant areas 311a are adjacent the plurality of first gate structures 330a in the first transistor region 321a. In some embodiments, a plurality of high voltage implant areas 311b are adjacent the plurality of second gate structures 330b in the second transistor region 321b.

Figure 8:
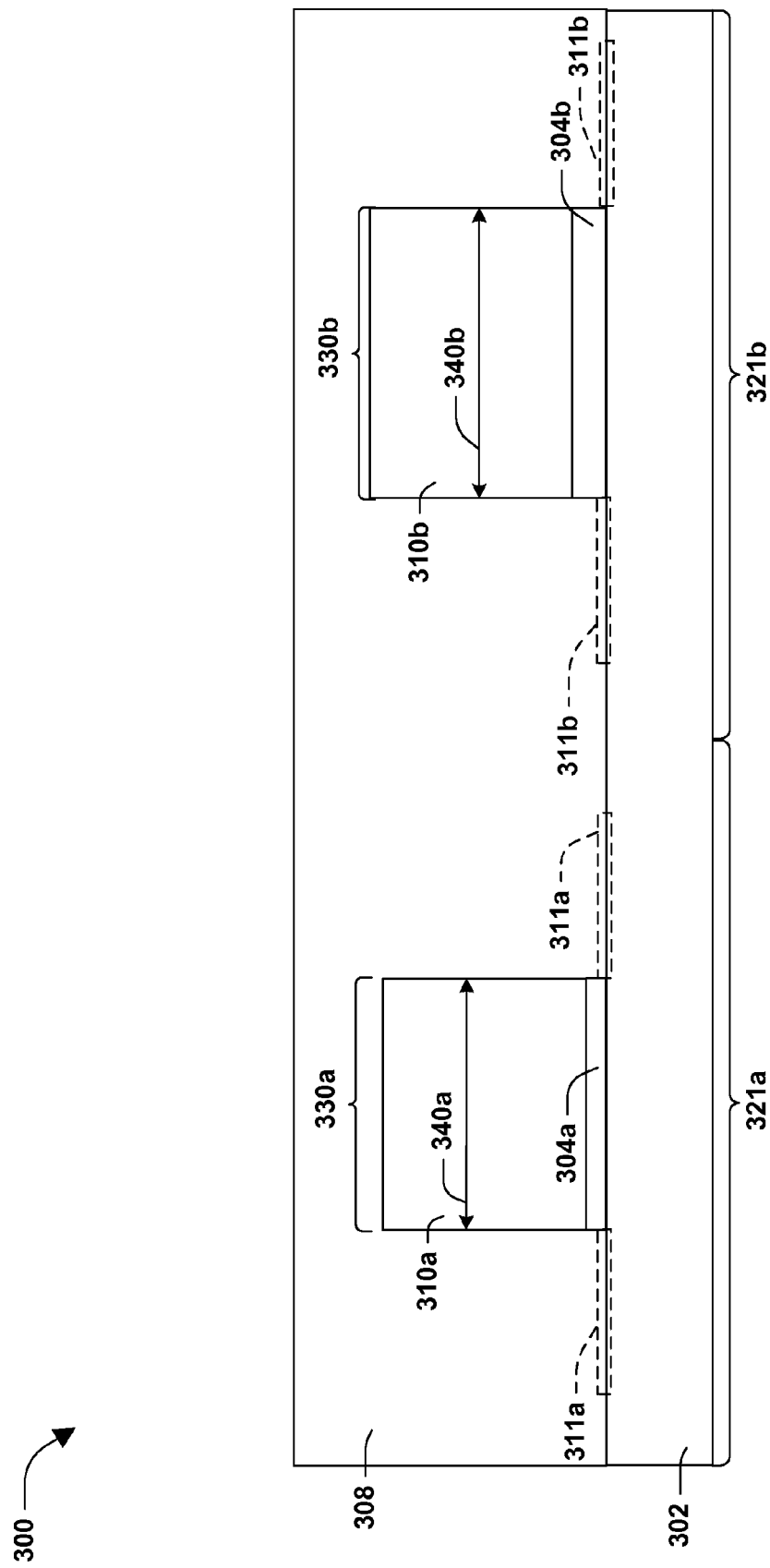
FIG. 8 is an illustration of a semiconductor arrangement, in accordance with some embodiments.
Figure 9:
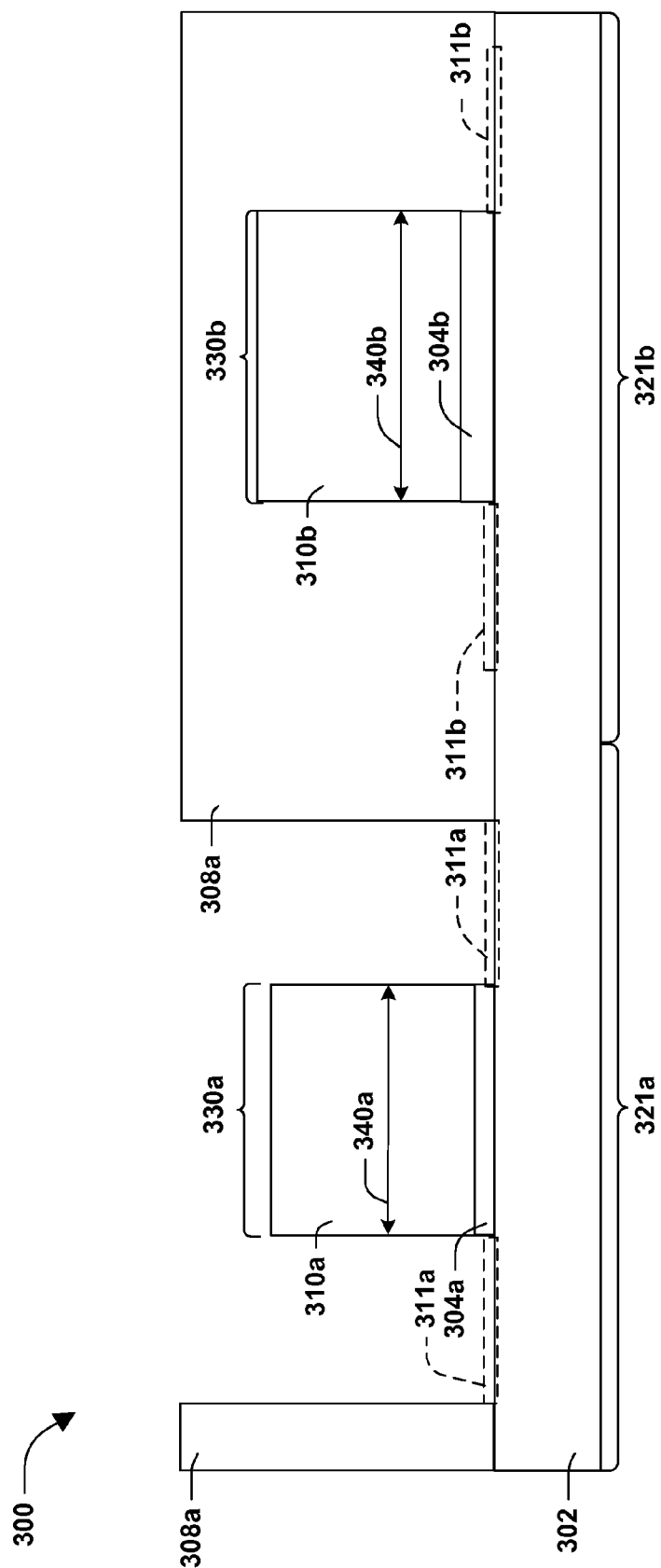
FIG. 9 is an illustration of a semiconductor arrangement, in accordance with some embodiments.

At 104 in method 100, a low voltage photoresist 308a is formed over the plurality of second gate structures 330b and the second transistor region 321b, such that the plurality of first gate structures 330a and the plurality of low voltage implant areas 311a are exposed, as illustrated in FIG. 9, according to some embodiments. Turning to FIG. 8, prior to FIG. 9, a first low voltage photoresist 308 is formed such as by deposition over the plurality of first gate structures 330a, the plurality of second gate structures 330b, and the substrate 302, according to some embodiments. In some embodiments, the first low voltage photoresist 308 is patterned to form the low voltage photoresist 308a, as illustrated in FIG. 9.

Figure 10:
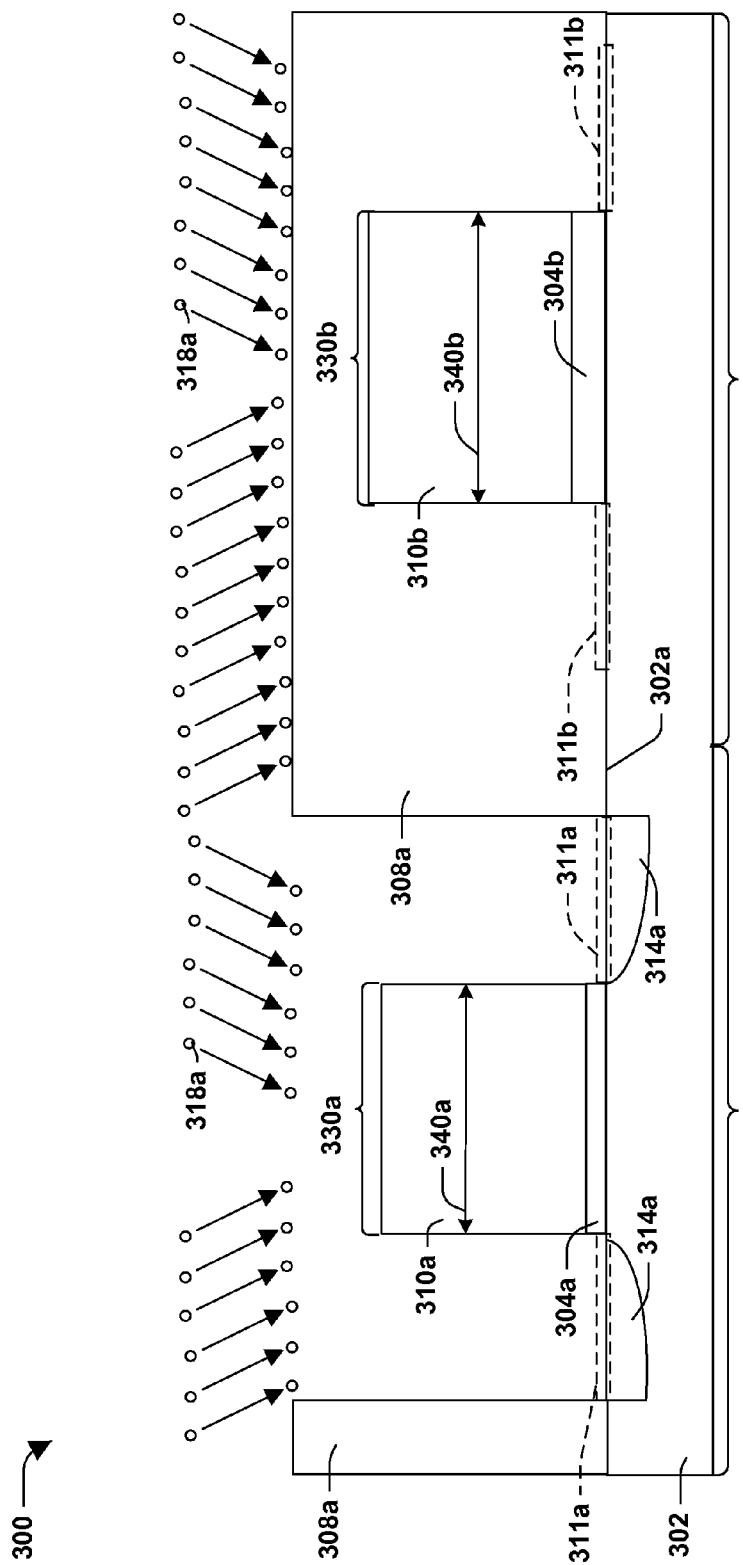
FIG. 10 is an illustration of a semiconductor arrangement, in accordance with some embodiments.

At 106 in method 100, a low voltage LDD implant is performed to implant a first low voltage dopant 318a into the plurality of low voltage implant areas 311a to form a plurality of low voltage shallow wells 314a, as illustrated with FIG. 10, according to some embodiments. In some embodiments, the first low voltage dopant 318a comprises at least one of boron, phosphorus, arsenic, antimony, boron, boron fluoride, nitrogen or carbon. In some embodiments, the first low voltage dopant 318a is implanted at a dose and energy used in the fabrication of devices with the selected voltage rating. In some embodiments, a first anneal is performed on the semiconductor arrangement 300, such that the plurality of low voltage shallow wells 314a migrate under the plurality of first gate structures 330a. In some embodiments, the low voltage photoresist 308a inhibits the first low voltage dopant 318a from entering into the areas under the low voltage photoresist 308a. In some embodiments, the first low voltage dopant 318a is implanted at a first angle used in the fabrication of devices with the selected voltage rating.

Figure 11:
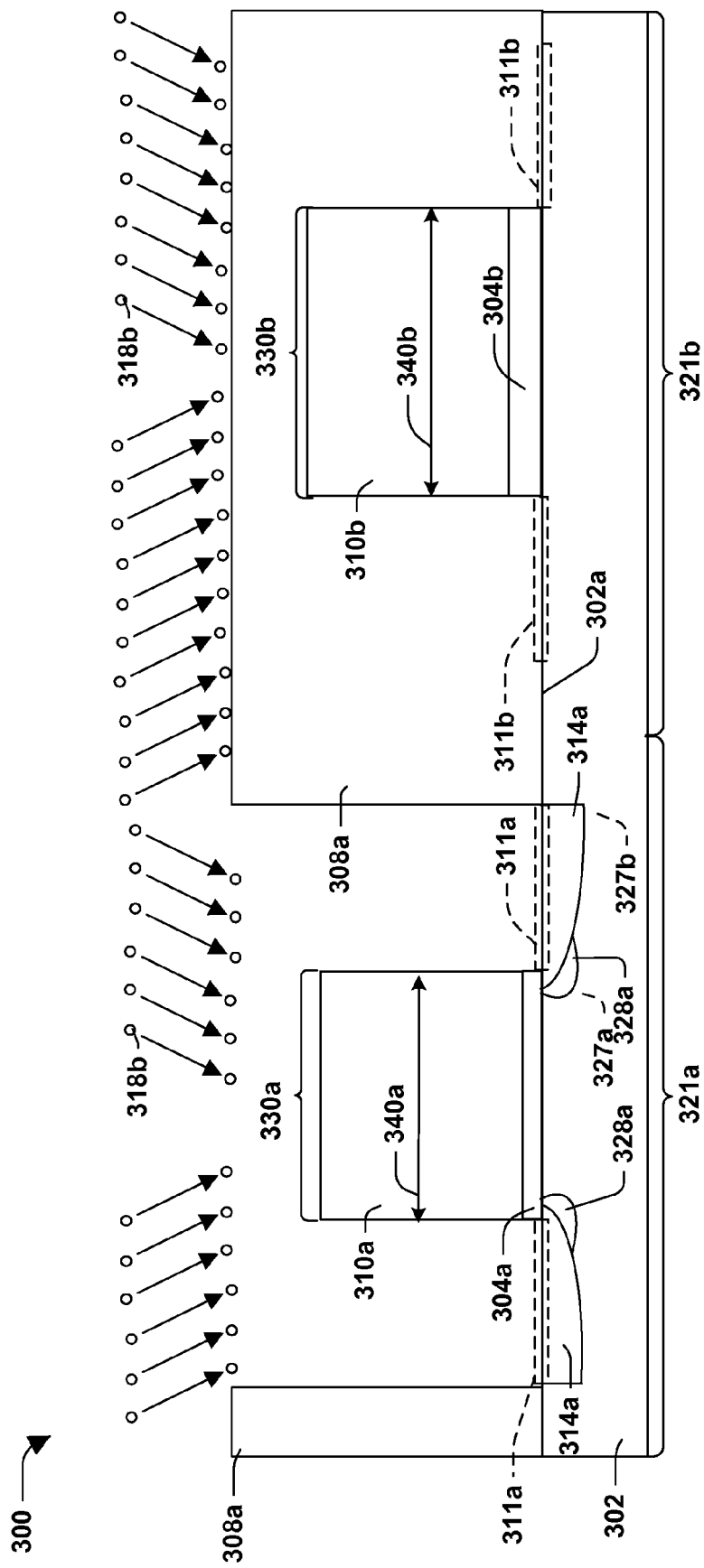
FIG. 11 is an illustration of a semiconductor arrangement, in accordance with some embodiments.
Figure 12:
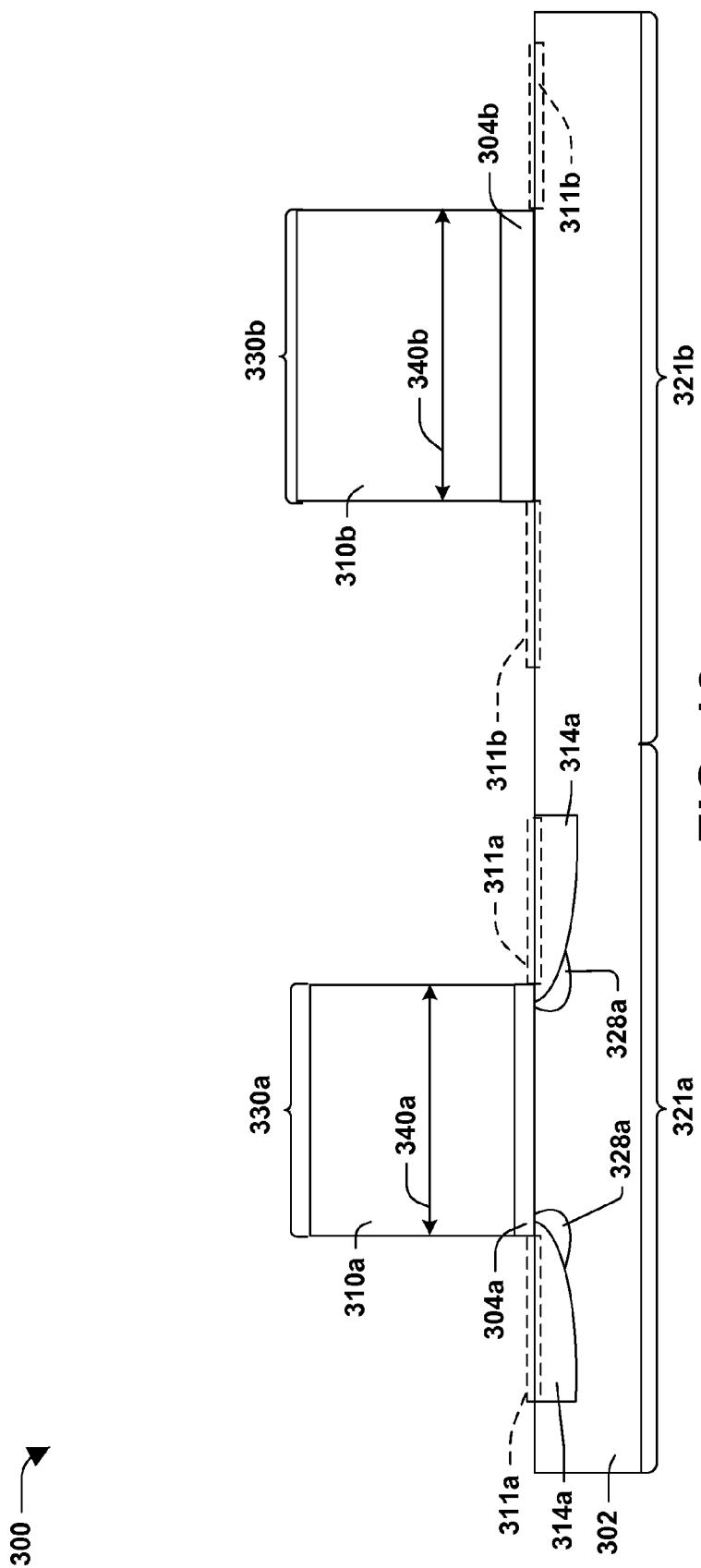
FIG. 12 is an illustration of a semiconductor arrangement, in accordance with some embodiments.

At 108 in method 100, a low voltage pocket implant is performed to implant a second low voltage dopant 318b into the plurality of low voltage implant areas 311a to form a plurality of low voltage pocket implants 328a, as illustrated with FIG. 11, according to some embodiments. In some embodiments, the second low voltage dopant 318b comprises at least one of boron, phosphorus, arsenic, antimony, boron, boron fluoride, nitrogen or carbon. In some embodiments, the second low voltage dopant 318b is implanted at a dose and energy used in the fabrication of devices with the selected voltage rating. In some embodiments, the low voltage photoresist 308a inhibits the second low voltage dopant 318b from entering into the areas under the low voltage photoresist 308a. In some embodiments, the second low voltage dopant 318b is implanted at a second angle used in the fabrication of devices with the selected voltage rating. In some embodiments, the plurality of low voltage pocket implants 328a are at least partially under the plurality of first gate structures 330a. In some embodiments, a second anneal is performed on the semiconductor arrangement 300, such that the plurality of low voltage shallow wells 314a and the plurality of low voltage pocket implants 328a migrate under the plurality of first gate structures 330a. In some embodiments, the low voltage photoresist 308a is removed, such as by at least one of acid washing or etching, from the plurality of second gate structures 330b and the second transistor region 321b, as illustrated in FIG. 12.

Figure 13:
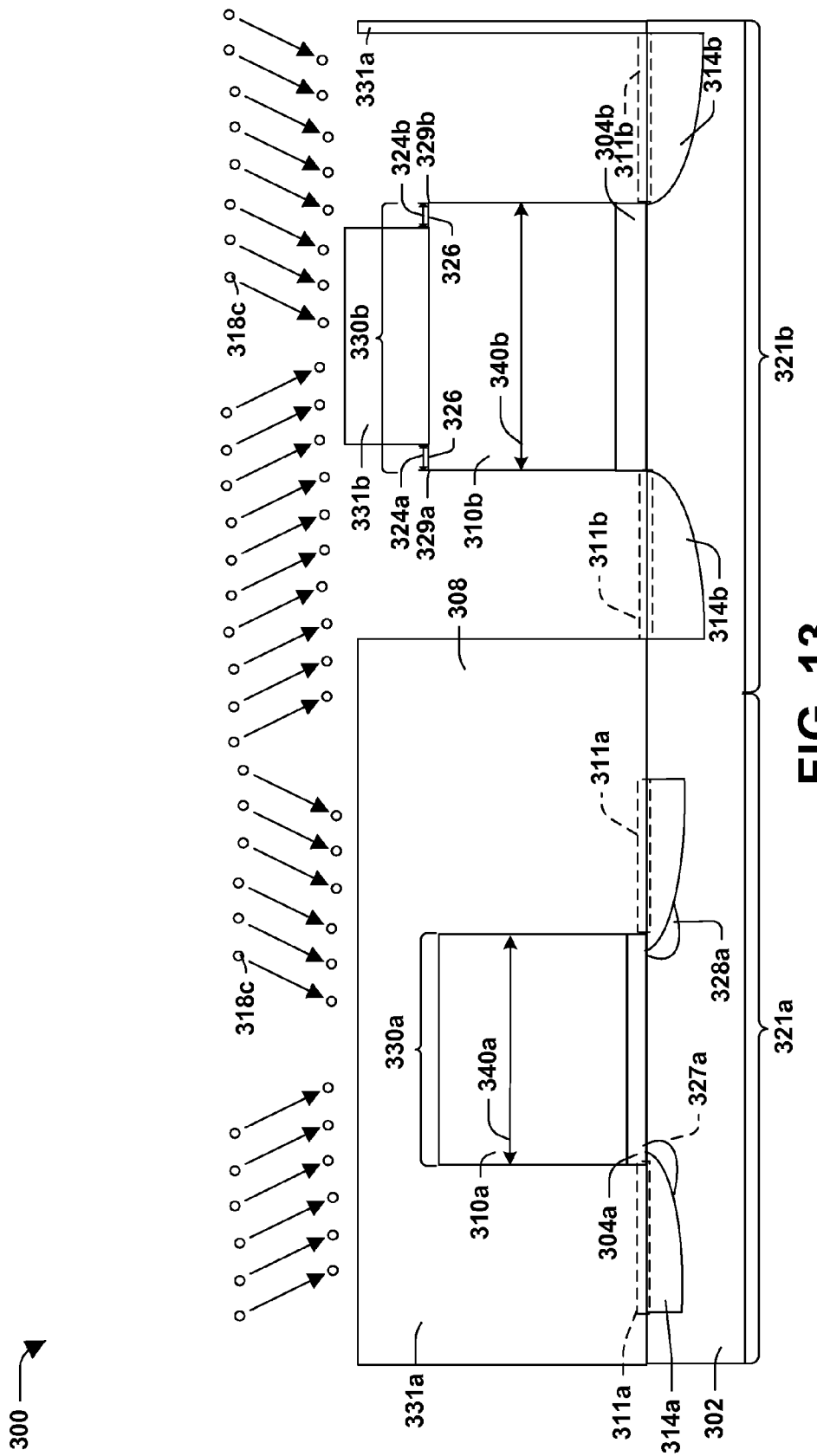
FIG. 13 is an illustration of a semiconductor arrangement, in accordance with some embodiments.

At 110 in the method 100, a high voltage photoresist 331a is formed over the plurality of first gate structures 330a, over the first transistor region 321a of the substrate and a plurality of high voltage residual photoresists 331b are formed over the plurality of second gate structures 330b, such that the plurality of high voltage implant areas 311b of the substrate 302 and a plurality of second top portions 326 of the plurality of second gate structures 330b are exposed, as illustrated in FIG. 13, according to some embodiments. In some embodiments, the high voltage photoresist 331a and plurality of high voltage residual photoresists 331b are formed by forming a first high voltage photoresist (not shown), such as by deposition, over the plurality of first gate structures 330a, the plurality of second gate structures 330b, and the substrate 302 and patterning the first high voltage photoresist, such as by at least one of acid washing or etching. In some embodiments, the plurality of high voltage residual photoresists 331b are between a plurality of second gate top portions 326, where the plurality of high voltage residual photoresists 331b are a first distance 324a from a first gate edge 329a and a second distance 324b from a second gate edge 329b. In some embodiments, the first distance 324a and the second distance 324b are different distances. In some embodiments, the first distance 324a is equal to the second distance 324b. In some embodiments, at least one of the first distance 324a is between about 30 nm to about 90 nm or the second distance 324b is between about 30 nm to about 90 nm.

At 112 in the method 100, a high voltage LDD implant is performed to implant a first high voltage dopant 318c into the plurality of high voltage implant areas 311b to form a plurality of high voltage shallow wells 314b, as illustrated with FIG. 13, according to some embodiments. In some embodiments, the first high voltage dopant 318c comprises at least one of boron, phosphorus, arsenic, antimony, boron, boron fluoride, nitrogen or carbon. In some embodiments, the first high voltage dopant 318c is implanted at a dose and energy used in the fabrication of devices with the selected voltage rating. In some embodiments, a third anneal is performed on the semiconductor arrangement 300, such that the plurality of high voltage shallow wells 314b migrate under the plurality of second gate structures 330b. In some embodiments, the high voltage photoresist 331a inhibits the first high voltage dopant 318c from entering into the areas under the high voltage photoresist 331a. In some embodiments, the plurality of high voltage residual photoresists 331b similarly shield the plurality of second gate structures 330b from the first high voltage dopant 318c. In some embodiments, the first high voltage dopant 318c is implanted at a third angle used in the fabrication of devices with the selected voltage rating.

Figure 14:
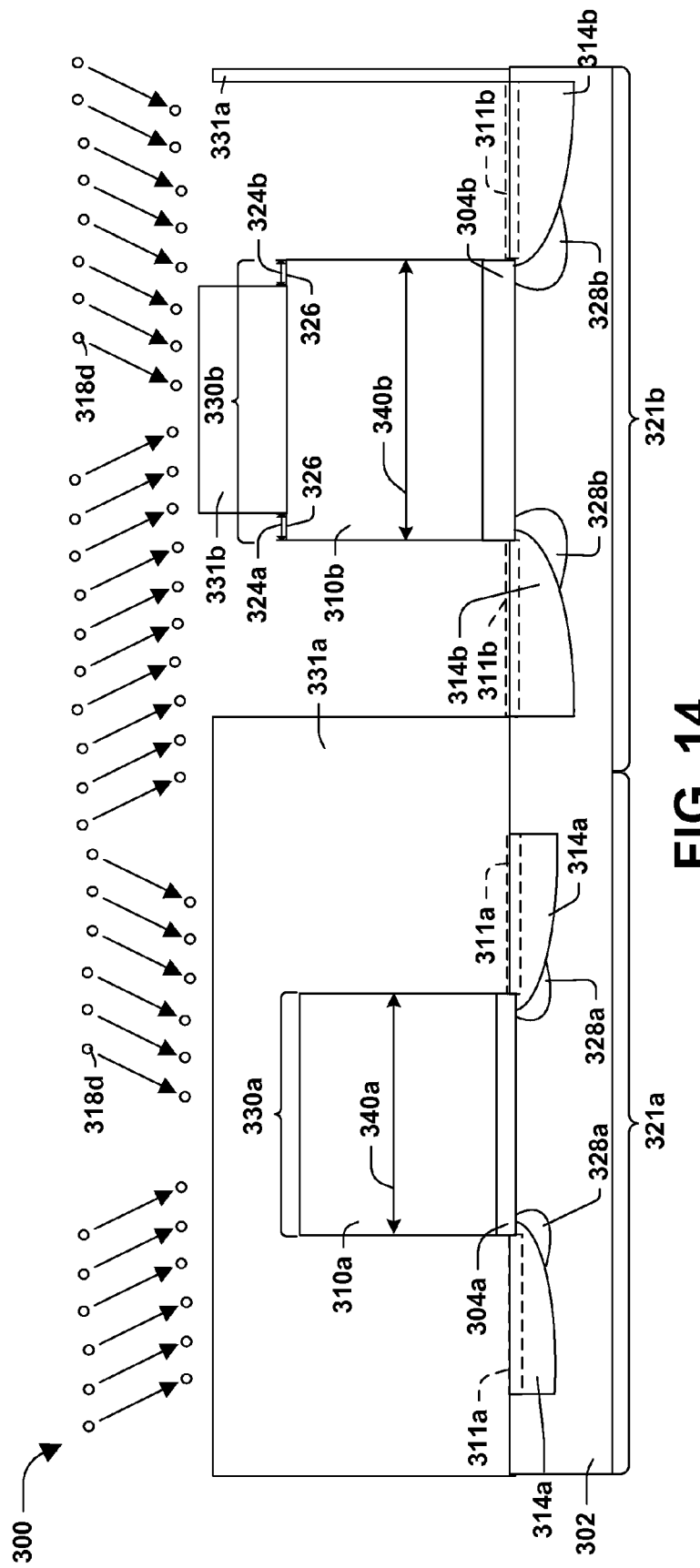
FIG. 14 is an illustration of a semiconductor arrangement, in accordance with some embodiments.
Figure 15:
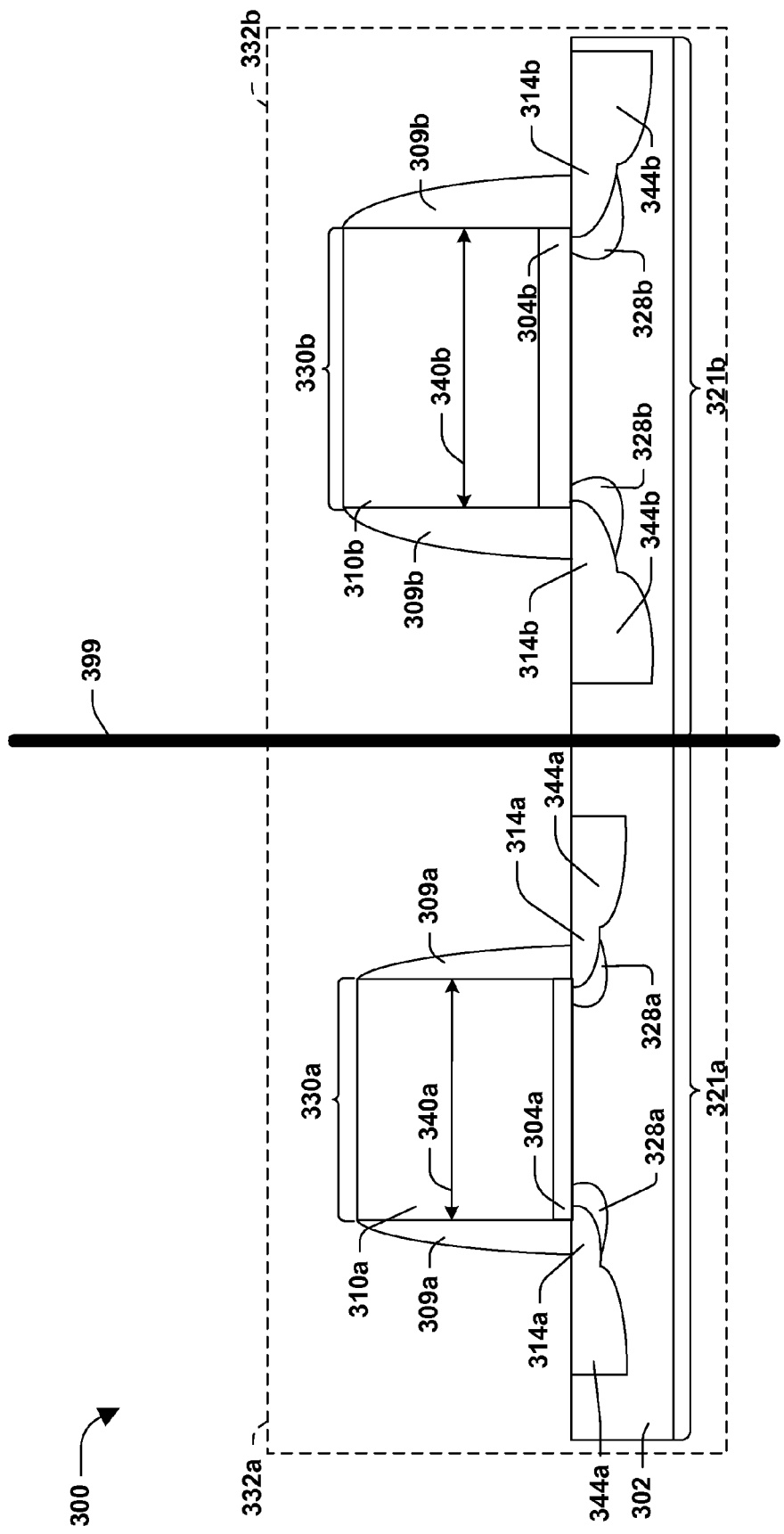
FIG. 15 is an illustration of a semiconductor arrangement, in accordance with some embodiments.

At 114 in method 100, a high voltage pocket implant is performed to implant a second high voltage dopant 318d into the plurality of high voltage implant areas 311b to form a plurality of high voltage pocket implants 328b, as illustrated with FIG. 14, according to some embodiments. In some embodiments, the second high voltage dopant 318d comprises at least one of boron, phosphorus, arsenic, antimony, boron, boron fluoride, nitrogen or carbon. In some embodiments, the second high voltage dopant 318d is implanted at a dose and energy used in the fabrication of devices with the selected voltage rating. In some embodiments, the high voltage photoresist 331a inhibits the second high voltage dopant 318d from entering into the areas under the high voltage photoresist 331a. In some embodiments, the plurality of high voltage residual photoresists 331b similarly shield the plurality of second gate structures 330b from the second high voltage dopant 318d. In some embodiments, the second high voltage dopant 318d is implanted at a fourth angle used in the fabrication of devices with the selected voltage rating. In some embodiments, the plurality of high voltage pocket implants 328b are at least partially under the plurality of second gate structures 330b. In some embodiments, a fourth anneal is performed on the semiconductor arrangement 300, such that the plurality of high voltage shallow wells 314b and the plurality of high voltage pocket implants 328b migrate under the plurality of second gate structures 330b. In some embodiments, the high voltage photoresist 331a and the plurality of high voltage residual photoresists 331b are removed, such as by at least one of acid washing or etching, from the plurality of second gate structures 330b, the plurality of first gate structures 330a and the first transistor region 321a, as illustrated in FIG. 15.

In some embodiments, a layer of sidewall material (not shown) is formed over the plurality of first gate structures 330a, the plurality of second gate structures 330b and the substrate 302. In some embodiments, the layer of sidewall material comprises nitride. In some embodiments, the layer of sidewall material is patterned to concurrently form a plurality of first sidewall spacers 309a adjacent the plurality of first gate structures 330a and a plurality of second sidewall spacers 309b adjacent the plurality of second gate structures 330b.

In some embodiments, a low voltage deep well implant is performed, in association with a correspondingly patterned photoresist (not shown), to implant a third low voltage dopant (not shown) into the plurality of low voltage shallow wells 314a to form a first source drain region 344a, as illustrated in FIG. 15, according to some embodiments. In some embodiments, the third low voltage dopant comprises at least one of boron, phosphorus, arsenic, antimony, boron, boron fluoride, nitrogen or carbon. In some embodiments, the third low voltage dopant is implanted at a dose and energy used in the fabrication of devices with the selected voltage rating. In some embodiments, a high voltage deep well implant is performed, in association with a correspondingly patterned photoresist (not shown), to implant a third high voltage dopant (not shown) into the plurality of high voltage shallow wells 314b to form a second source drain region 344b, as illustrated in FIG. 15, according to some embodiments. In some embodiments, the third high voltage dopant comprises at least one of boron, phosphorus, arsenic, antimony, boron, boron fluoride, nitrogen or carbon. In some embodiments, the third high voltage dopant is implanted at a dose and energy used in the fabrication of devices with the selected voltage rating.

Given that the first distance 324a is not equal to the second distance 324b in some embodiments, such as due to imprecision in aligning or forming the plurality of high voltage residual photoresists 331b with respect to the plurality of second gate structures 330b, at least one of the plurality of high voltage shallow wells 314b, the plurality of high voltage pocket implants 328b or the plurality of second source drain regions 344b are asymmetrical about respective second gate structure 330b. According to some embodiments, a size of a second source drain region on one side of a second gate structure is different than a size of a second source drain region on the other side of the second gate structure. This asymmetry of dopants implanted around the second gate structure produces a different characteristic curve when the second transistor is forward biased as compared to when the second transistor is reverse biased, according to some embodiments.

Figure 2:
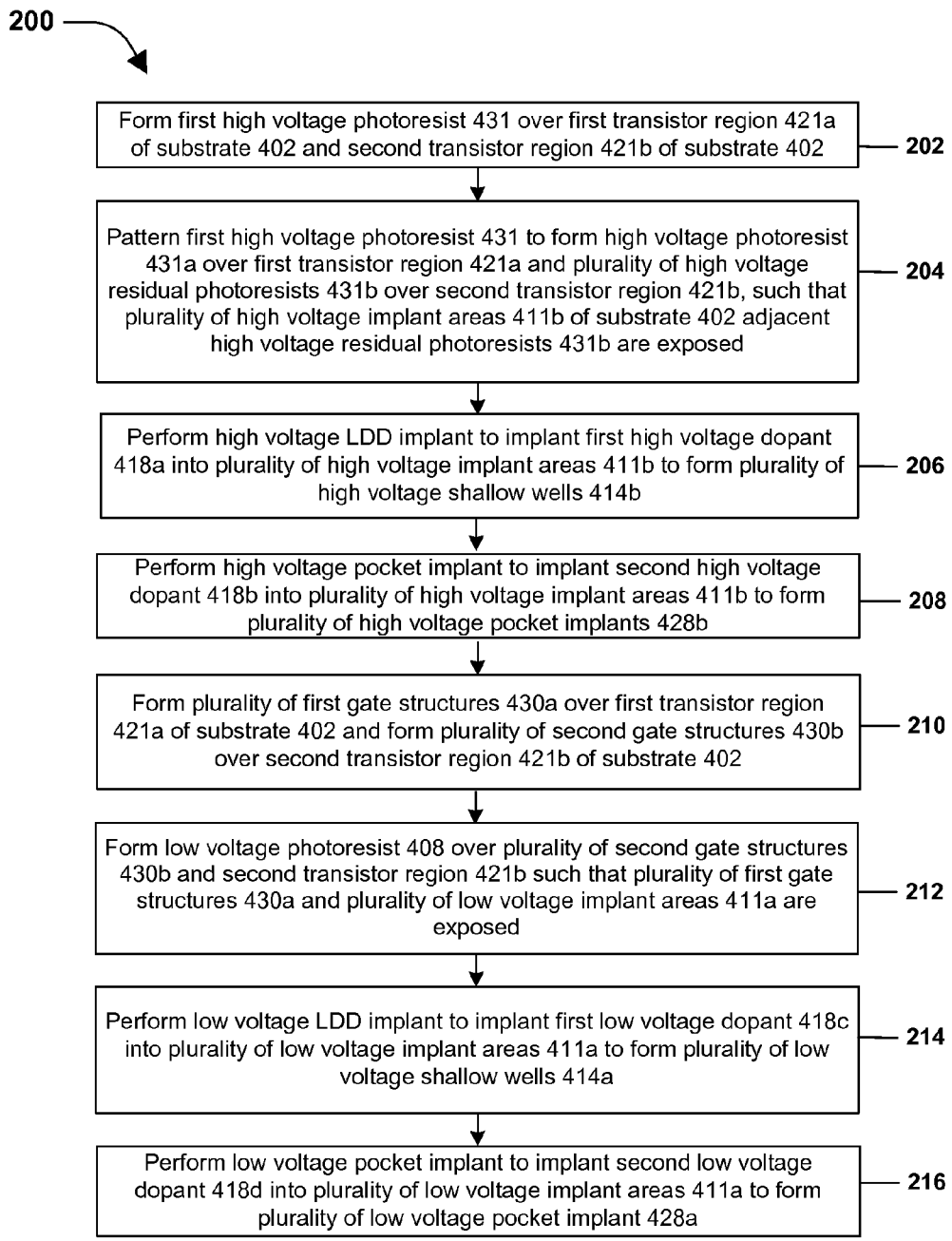
FIG. 2 is a flow diagram illustrating a method of semiconductor fabrication, in accordance with some embodiments.
Figure 24:
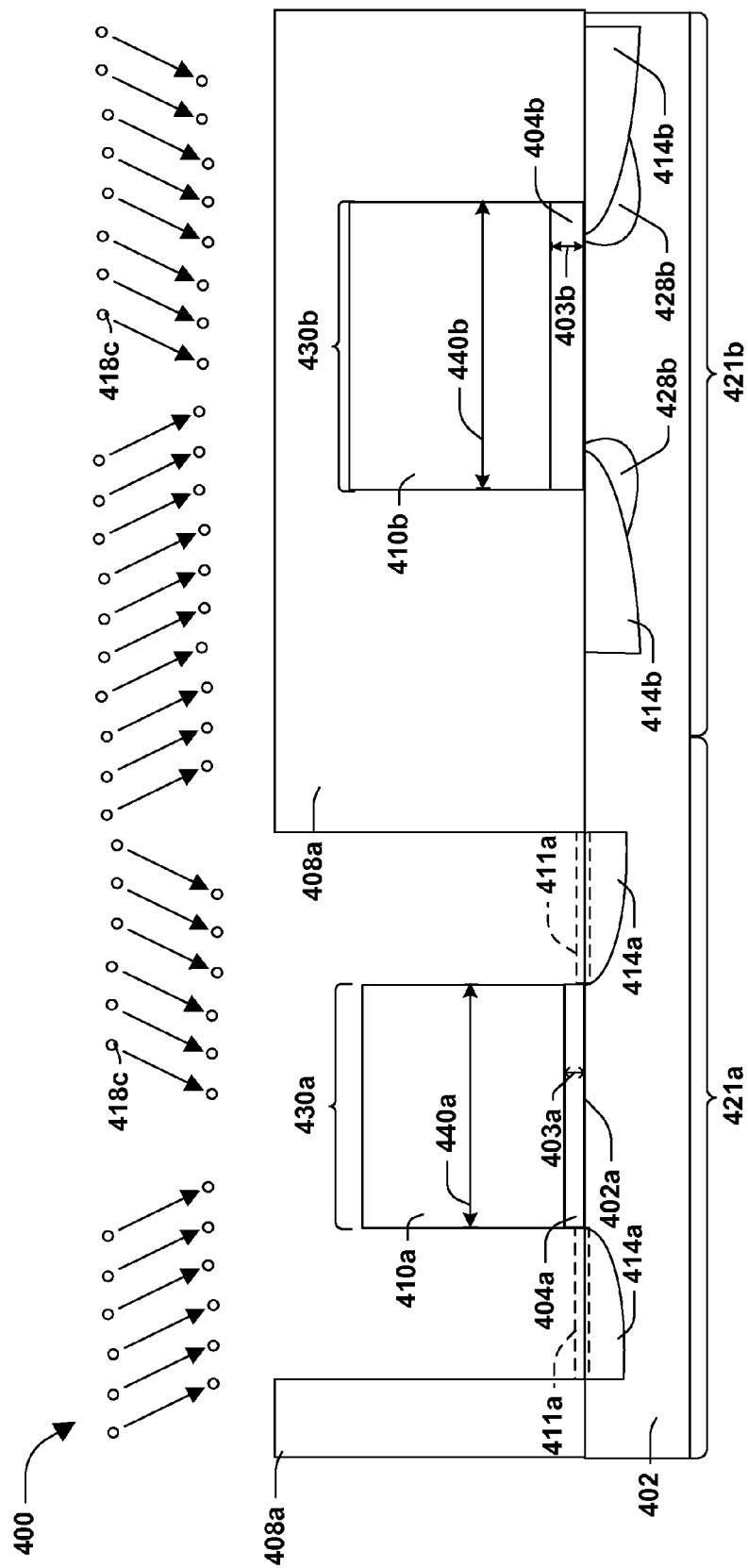
FIG. 24 is an illustration of a semiconductor arrangement, in accordance with some embodiments.
Figure 25:
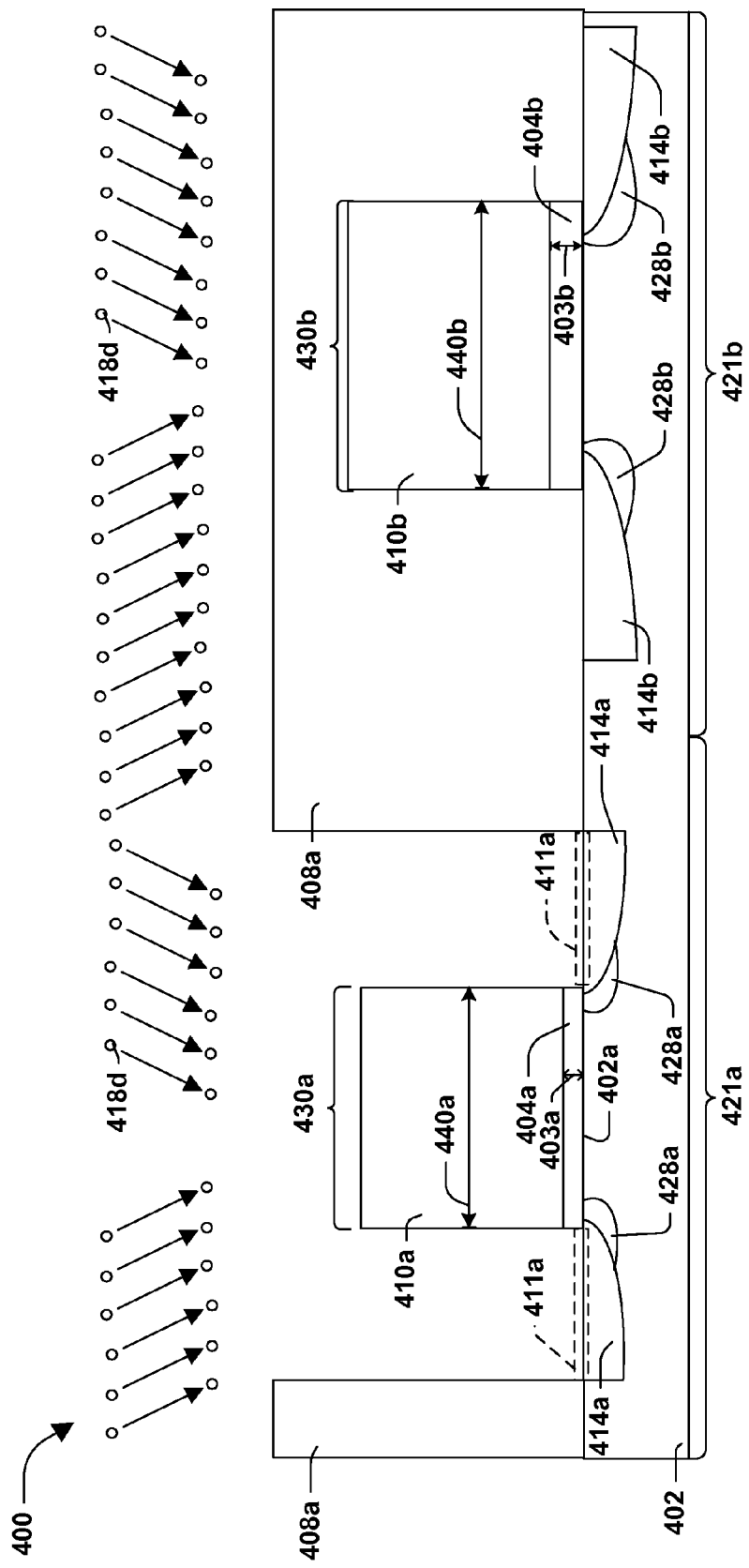
FIG. 25 is an illustration of a semiconductor arrangement, in accordance with some embodiments.
Figure 26:
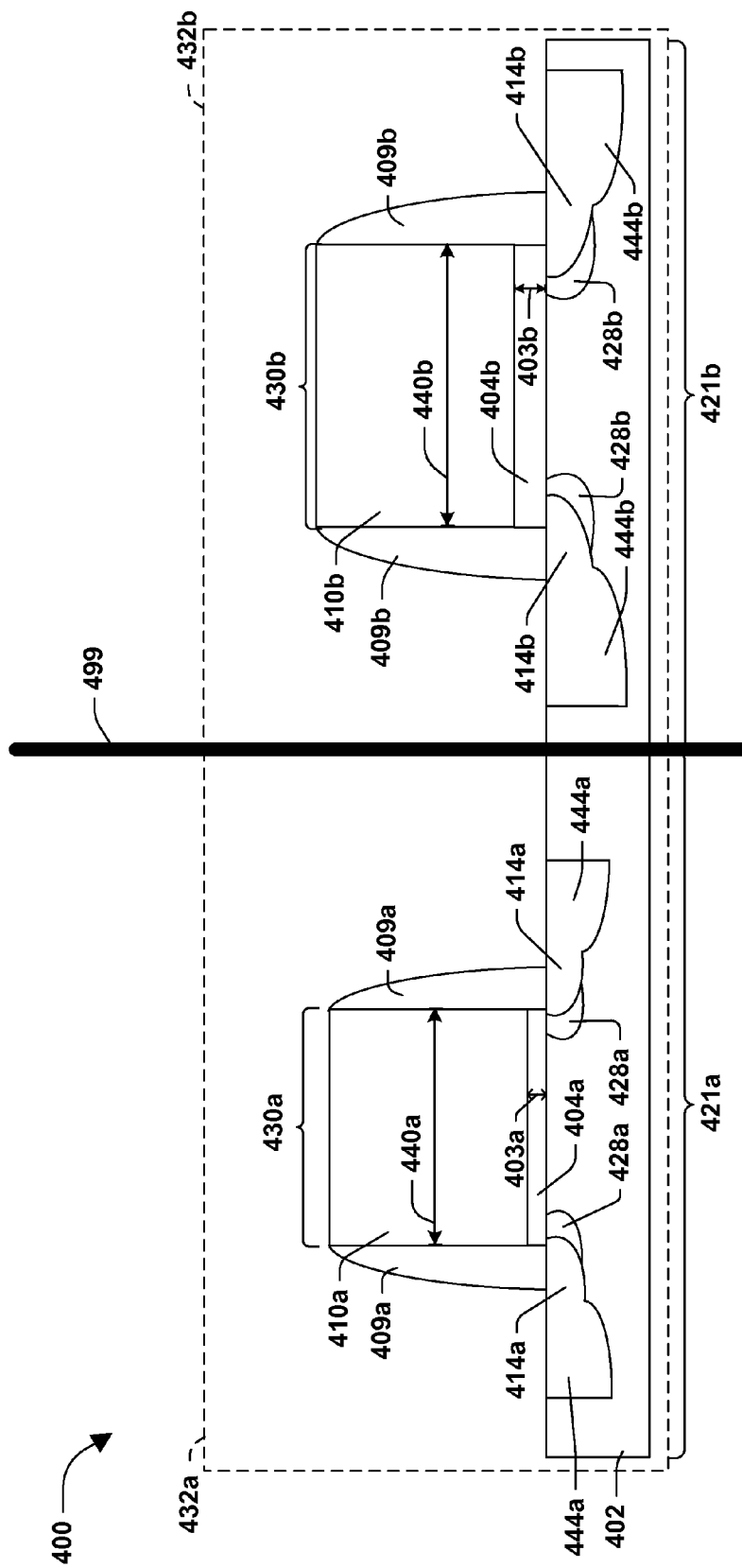
FIG. 26 is an illustration of a semiconductor arrangement, in accordance with some embodiments.

A second method 200 of semiconductor fabrication according to some embodiments is illustrated in FIG. 2, and one or more structures formed thereby at various stages of fabrication are illustrated in FIGS. 16-26. According to some embodiments, such as illustrated in FIG. 26, a semiconductor arrangement 400 comprises a plurality of first transistors 432a having a first operating voltage in a first transistor region 421a adjacent a plurality of second transistors 432b having a second operating voltage greater than the first operating voltage, the plurality of second transistors 432a in a second transistor region 421b over a substrate 402. It will be appreciated that many transistors and features, elements, etc. thereof are formed in different regions described herein, and that merely single instances of the same are illustrated in the Figs. for simplicity. Line 499 illustrates that first transistors 432a are generally electrically isolated or decoupled from second transistors 432b. In some embodiments, the plurality of first transistors 432a comprises a plurality of first gate structures 430a and a plurality of first sidewall spacers 409a adjacent the plurality of first gate structures 430a. In some embodiments, a plurality of first source drain regions 444a are in the substrate 402 adjacent the plurality of first gate structures 430a. In some embodiments, a plurality of low voltage pocket implants 428a are adjacent the plurality of first source drain regions 444a, such that the plurality of low voltage pocket implants 428a extend farther under the plurality of first gate structures 430a than the plurality of first source drain regions 444a. In some embodiments, the plurality of second transistors 432b comprises a plurality of second gate structures 430b and a plurality of second sidewall spacers 409b adjacent the plurality of second gate structures 430b. In some embodiments, a plurality of second source drain regions 444b are in the substrate 402 adjacent the plurality of second gate structures 430b. In some embodiments, a plurality of high voltage pocket implants 428b are adjacent the plurality of second source drain regions 444b, such that the plurality of high voltage pocket implants 428b extend farther under the plurality of second gate structures 430b than the plurality of second source drain regions 444b. In some embodiments, the plurality of first transistors 432a comprises at least one of a low voltage device or a medium voltage device. In some embodiments, the plurality of second transistors 432b comprises at least one of the medium voltage device or the high voltage device. In some embodiments, the plurality of first transistors 432a are a different type, such as a different device voltage type than the plurality of second transistors 432b. In some embodiments, the low voltage device has an operating voltage of less than about 1.5V. In some embodiments, the medium voltage device has an operating voltage between about 3.3V to about 10V. In some embodiments, the high voltage device has an operating voltage above about 30V. In some embodiments, the semiconductor arrangement 400 formed according to the second method 200 has a thinner gate electrode than an arrangement not formed according to the second method 200. In some embodiments, the plurality of first transistors 432a and the plurality of second transistors 432b are formed as part of a single CMOS fabrication process without need for additional masks.

Figure 16:
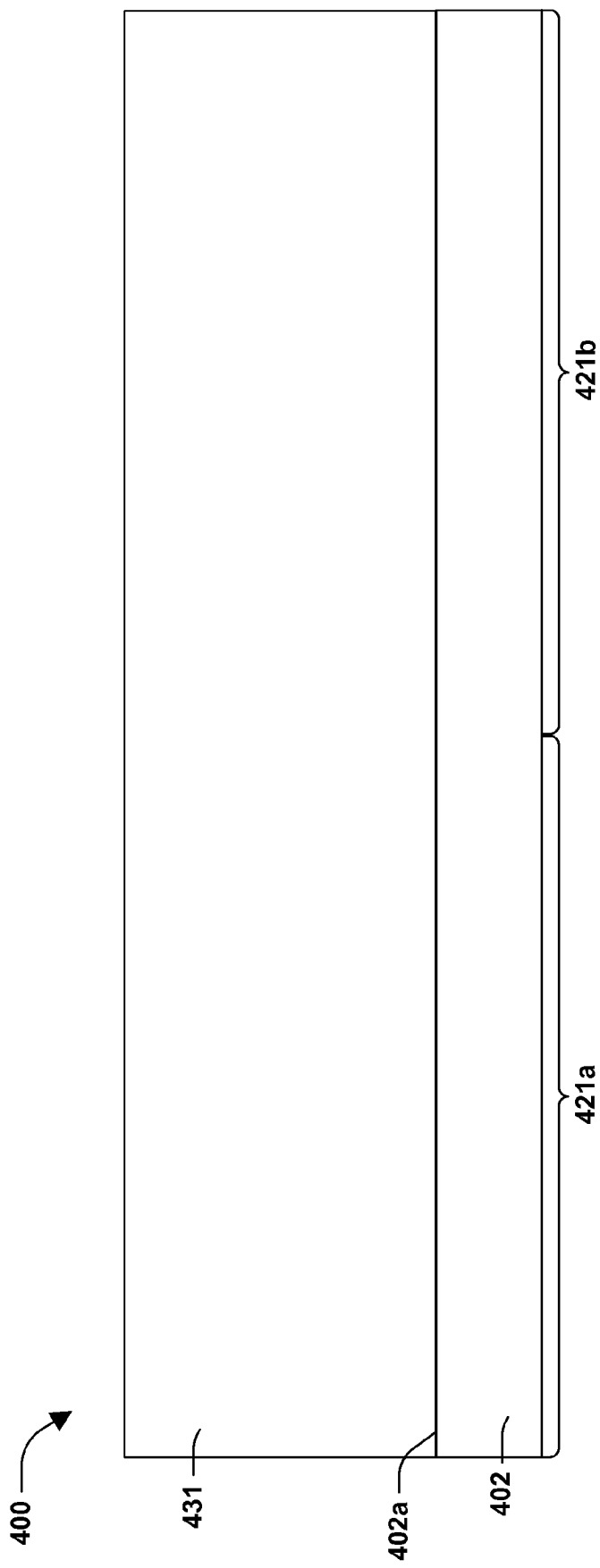
FIG. 16 is an illustration of a semiconductor arrangement, in accordance with some embodiments.

At 202 in method 200, a first high voltage photoresist 431 is formed over a first transistor region 421a of the substrate 402 and a second transistor region 421b of the substrate 402, as illustrated in FIG. 16, according to some embodiments. In some embodiments, the substrate 402 comprises at least one of silicon or germanium. According to some embodiments, the substrate 402 comprises at least one of an epitaxial layer, a silicon-on-insulator (SOI) structure, a wafer, or a die formed from a wafer.

Figure 17:
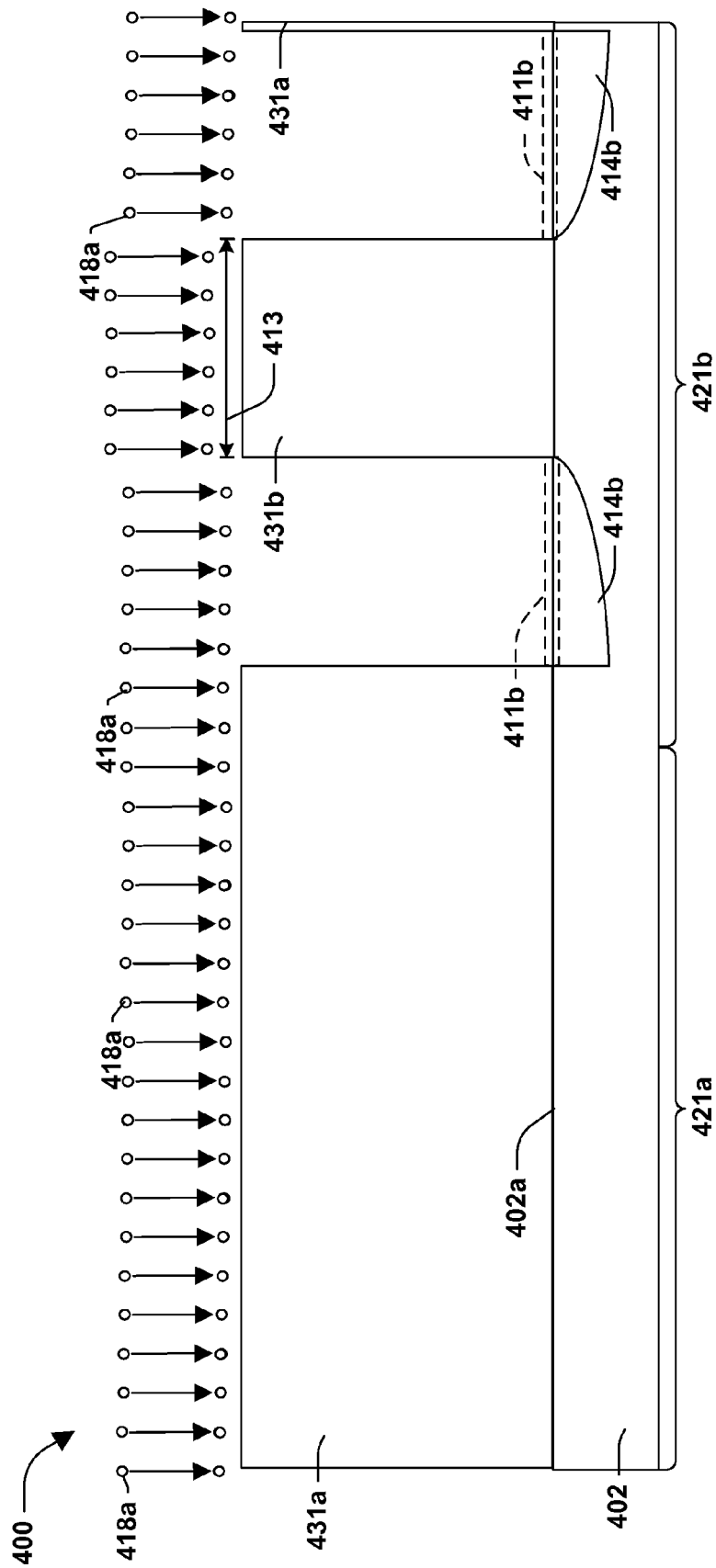
FIG. 17 is an illustration of a semiconductor arrangement, in accordance with some embodiments.

At 204 in method 200, the first high voltage photoresist 431 is patterned to form a high voltage photoresists 431a over the first transistor region 421a and to form a plurality of high voltage residual photoresists 431b over the second transistor region 421b, such that a plurality of high voltage implant areas 411b of the substrate 402 adjacent the plurality of high voltage residual photoresists 431b are exposed, as illustrated in FIG. 17, according to some embodiments. In some embodiments, the plurality of high voltage residual photoresists 431b have a first residual photoresist width 413 between about 350 nm to about 450 nm.

At 206 in method 200, a high voltage LDD implant is performed to implant a first high voltage dopant 418a into the plurality of high voltage implant areas 411b to form a plurality of high voltage shallow wells 414b, as illustrated with FIG. 17, according to some embodiments. In some embodiments, the first high voltage dopant 418a comprises at least one of boron, phosphorus, arsenic, antimony, boron, boron fluoride, nitrogen or carbon. In some embodiments, the first high voltage dopant 418a is implanted at a dose and energy used in the fabrication of devices with the selected voltage rating. In some embodiments, a first anneal is performed on the semiconductor arrangement 400, such that the plurality of high voltage shallow wells 414b migrate under the plurality of high voltage residual photoresists 431b. In some embodiments, the high voltage photoresist 431a inhibits the first high voltage dopant 418a from entering into the areas of the substrate 402 under the high voltage photoresist 431a. In some embodiments, the plurality high voltage residual photoresist 431b similarly shield the substrate 402 from the first high voltage dopant 418a. In some embodiments, the first high voltage dopant 418a is implanted at a first angle incident to the surface 402a of the substrate 402, where the first angle is substantially perpendicular to the surface 402a of the substrate 402. In some embodiments, the first angle comprises an angle that is used in the fabrication of devices with the selected voltage rating.

At 208 in method 200, a high voltage pocket implant is performed to implant a second high voltage dopant 418b into the plurality of high voltage implant areas 411b to form a plurality of high voltage pocket implants 428b, as illustrated in FIG. 18, according to some embodiments. In some embodiments, the second high voltage dopant 418b comprises at least one of boron, phosphorus, arsenic, antimony, boron, boron fluoride, nitrogen or carbon. In some embodiments, the second high voltage dopant 418b is implanted at a dose and energy used in the fabrication of devices with the selected voltage rating. In some embodiments, the high voltage photoresist 431a inhibits the second high voltage dopant 418b from entering into the areas of the substrate 402 under the high voltage photoresist 431a. In some embodiments, the plurality of high voltage residual photoresists 431b similarly shield the substrate 402 from the second high voltage dopant 418b. In some embodiments, the second high voltage dopant 418b is implanted at a second angle incident to the surface 402a of the substrate 402, where the second angle is substantially perpendicular to the surface 402a of the substrate 402. In some embodiments, the second angle comprises an angle that is used in the fabrication of devices with the selected voltage rating. In some embodiments, the plurality of high voltage pocket implants 428b are at least partially under the plurality of high voltage residual photoresists 431b. In some embodiments, a second anneal is performed on the semiconductor arrangement 400, such that the plurality of high voltage shallow wells 414b and the plurality of high voltage pocket implants 428b migrate under the plurality of high voltage residual photoresists 431b. In some embodiments, the high voltage photoresist 431a and the plurality of high voltage residual photoresists 431b are removed, such as by at least one of acid washing or etching, as illustrated in FIG. 19.

Figure 22:
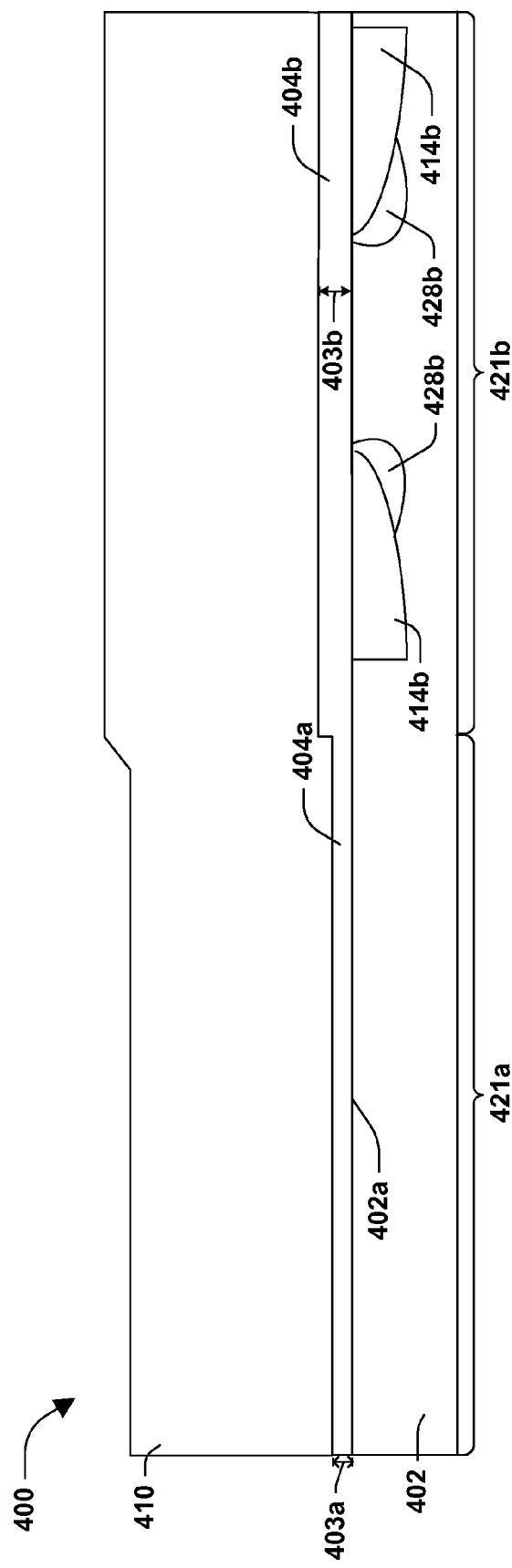
FIG. 22 is an illustration of a semiconductor arrangement, in accordance with some embodiments.
Figure 23:
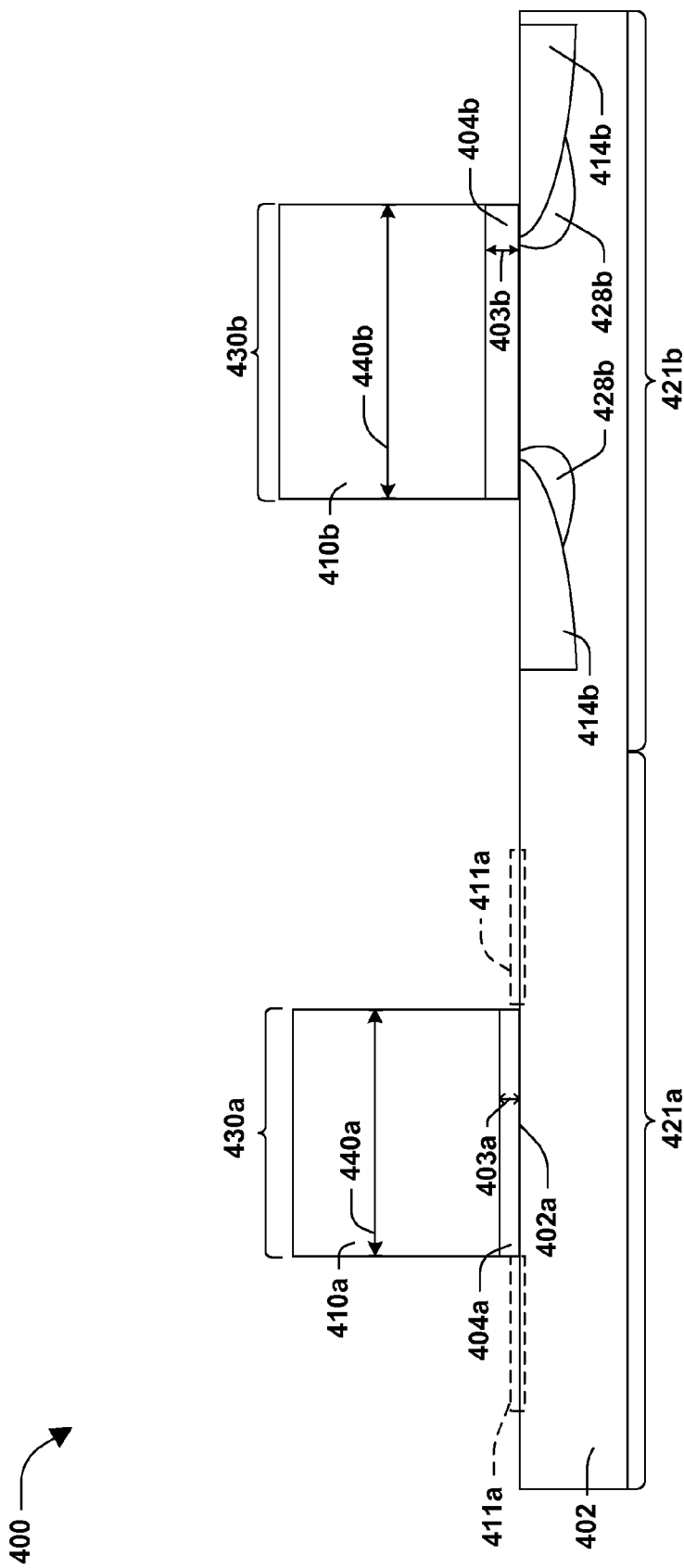
FIG. 23 is an illustration of a semiconductor arrangement, in accordance with some embodiments.

At 210 in method 200, the plurality of first gate structures 430a are formed over the first transistor region 421a of the substrate 402 and the plurality of second gate structures 430b are formed over the second transistor region 421b of the substrate 402, such that the plurality of second gate structures 430b are adjacent the plurality of low voltage shallow wells 414b, as illustrated in FIG. 23, according to some embodiments. Turning to FIG. 19, prior to FIG. 23, a first layer of gate dielectric material 404 is formed over the substrate 402, in the same manner as described above with regards to the first layer of gate dielectric material 304, such as illustrated in FIG. 3, according to some embodiments. In some embodiments, the first layer of gate dielectric material 404 is removed from the first transistor 431a region of the substrate 402, as illustrated in FIG. 20, in the same manner as described above in regards to the first layer of gate dielectric material 304, such as illustrated in FIG. 4. In some embodiments, a second layer of gate dielectric material 405 is formed over the first layer of gate dielectric material 404 to form a low voltage gate dielectric 404a and a high voltage gate dielectric 404b, as illustrated in FIG. 21, in the same manner as described above with regards to the formation of the low voltage gate dielectric 304a and the high voltage gate dielectric 304b, such as illustrated in FIG. 5. In some embodiments, a layer of gate electrode material 410 is formed over the low voltage gate dielectric 404a and the high voltage gate dielectric 404b, as illustrated in FIG. 22, in the same manner as described above with regard to the layer of gate electrode material 310, such as illustrated in FIG. 6. In some embodiments, the layer of gate electrode material 410, the low voltage gate dielectric 404a and the high voltage gate dielectric 404b are patterned to concurrently form the plurality of first gate structures 430a in the first transistor region 421a and the plurality of second gate structures 430b in the second transistor region 421b, as illustrated in FIG. 23. In some embodiments, respective gate structures of the plurality of first gate structures 430a have a first width 440a and respective gate structures of the plurality of second gate structures 430b have a second width 440b. In some embodiments, the second width 440b is greater than the first width 440a. In some embodiments, the second width 440b is greater than the first residual photoresist width 413 such that at least one of at least some of the plurality of high voltage shallow wells 414b or at least some of the plurality of high voltage pocket implants 428b are under the plurality of second gate structures 430b.

At 212 in method 200, a low voltage photoresist 408a is formed over the plurality of second gate structures 430b and the second transistor region 421b, such that the plurality of first gate structures 430a and a plurality of low voltage implant areas 411a adjacent the plurality of first gate structures 430a are exposed, as illustrated in FIG. 24, according to some embodiments. In some embodiments, a first low voltage photoresist (not shown) is formed over the plurality of first gate structures 430a, the plurality of second gate structures 430b, and the substrate 402, according to some embodiments. In some embodiments, the first low voltage photoresist is patterned to form the low voltage photoresist 408a.

At 214 in method 200, a low voltage LDD implant is performed to implant a first low voltage dopant 418c into the plurality of low voltage implant areas 411a to form a plurality of low voltage shallow wells 414a, as illustrated with FIG. 24, according to some embodiments. In some embodiments, the first low voltage dopant 418c comprises at least one of boron, phosphorus, arsenic, antimony, boron, boron fluoride, nitrogen or carbon. In some embodiments, the first low voltage dopant 418c is implanted at a dose and energy used in the fabrication of devices with the selected voltage rating. In some embodiments, a third anneal is performed on the semiconductor arrangement 400, such that the plurality of low voltage shallow wells 414a migrate under the plurality of first gate structures 430a. In some embodiments, the low voltage photoresist 408a inhibits the first low voltage dopant 418c from entering into the areas under the low voltage photoresist 408a. In some embodiments, the first low voltage dopant 418c is implanted at a third angle used in the fabrication of devices with the selected voltage rating.

At 216 in method 200, a low voltage pocket implant is performed to implant a second low voltage dopant 418d into the plurality of low voltage implant areas 411a to form a plurality of low voltage pocket implants 428a, as illustrated with FIG. 25, according to some embodiments. In some embodiments, the second low voltage dopant 418d comprises at least one of boron, phosphorus, arsenic, antimony, boron, boron fluoride, nitrogen or carbon. In some embodiments, the second low voltage dopant 418d is implanted at a dose and energy used in the fabrication of devices with the selected voltage rating. In some embodiments, the low voltage photoresist 408a inhibits the second low voltage dopant 418d from entering into the areas under the low voltage photoresist 408a. In some embodiments, the second low voltage dopant 418d is implanted at a fourth angle used in the fabrication of devices with the selected voltage rating. In some embodiments, the plurality of low voltage pocket implants 428a are at least partially under the plurality of first gate structures 430a. In some embodiments, a fourth anneal is performed on the semiconductor arrangement 400, such that the plurality of low voltage shallow wells 414a and the plurality of low voltage pocket implants 428a migrate under the plurality of first gate structures 430a. In some embodiments, the low voltage photoresist 408a is removed, such as by at least one of acid washing or etching, from the plurality of second gate structures 430a and the substrate 402, as illustrated in FIG. 26.

In some embodiments, a layer of sidewall material (not shown) is formed over the plurality of first gate structures 430a, the plurality of second gate structures 430b and the substrate 402. In some embodiments, the layer of sidewall material comprises nitride. In some embodiments, the layer of sidewall material is patterned to concurrently form a plurality of first sidewall spacers 409a adjacent the plurality of first gate structures 430a and a plurality of second sidewall spacers 409b adjacent the plurality of second gate structures 430b.

In some embodiments, a low voltage deep well implant is performed, in association with a correspondingly patterned photoresist (not shown), to implant a third low voltage dopant (not shown) into the plurality of low voltage shallow wells 414a to form a first source drain region 444a, as illustrated in FIG. 26, according to some embodiments. In some embodiments, the third low voltage dopant comprises at least one of boron, phosphorus, arsenic, antimony, boron, boron fluoride, nitrogen or carbon. In some embodiments, the third low voltage dopant is implanted at a dose and energy used in the fabrication of devices with the selected voltage rating. In some embodiments, a high voltage deep well implant is performed, in association with a correspondingly patterned photoresist (not shown), to implant a third high voltage dopant (not shown) into the plurality of high voltage shallow wells 414b to form a second source drain region 444b, as illustrated in FIG. 26, according to some embodiments. In some embodiments, the third high voltage dopant comprises at least one of boron, phosphorus, arsenic, antimony, boron, boron fluoride, nitrogen or carbon. In some embodiments, the third high voltage dopant is implanted at a dose and energy used in the fabrication of devices with the selected voltage rating.

Given that the plurality of second gate structures 430b are formed over the plurality of high voltage shallow wells 414b and the plurality of high voltage pocket implants 428b after the plurality of high voltage shallow wells 414b and the plurality of high voltage pocket implants 428b are formed, at least one of the plurality of high voltage shallow wells 414b, the plurality of high voltage pocket implants 428b or the plurality of second source drain regions 444b are asymmetrical about respective second gate structures 430b, in some embodiments. According to some embodiments, a degree of overlap of a second gate structure relative to at least one of a high voltage shallow well, a high voltage pocket implant or a second source drain region on one side of the second gate structure is different than a degree of overlap of the second gate structure relative to at least one of a high voltage shallow well, a high voltage pocket implant or a second source drain region on the other side of the second gate structure. This asymmetry of dopants implanted around the second gate structure produces a different characteristic curve when the second transistor is forward biased as compared to when the second transistor is reverse biased, according to some embodiments.

According to some embodiments, a method of semiconductor fabrication, comprises forming a plurality of first transistors having a first operating voltage, the plurality of first transistors comprising a plurality of first gate structures over a first transistor region of a substrate, a plurality of low voltage shallow wells adjacent the plurality of first gate structures and a plurality of low voltage pocket implants adjacent the plurality of first gate structures. According to some embodiments, the method of semiconductor fabrication further comprises forming a plurality of second transistors having a second operating voltage adjacent the plurality of first transistors. In some embodiments, the forming a plurality of second transistors comprises forming a first high voltage photoresist over the plurality of first gate structures, over the first transistor region and over a plurality of second gate structures and the plurality of second gate structures over a second transistor region of the substrate, such that a plurality of high voltage implant areas of the substrate adjacent the plurality of second gate structures and a plurality of second gate top portions of the plurality of second gate structures are exposed. In some embodiments, the forming a plurality of second transistors further comprises performing a high voltage LDD implant at a first high energy to implant a first high voltage dopant into the plurality of high voltage implant areas to form a plurality of high voltage shallow wells adjacent the plurality of second gate structures and performing a high voltage pocket implant at a second high energy to implant a second high voltage dopant into the plurality of high voltage implant areas to form a plurality of high voltage pocket implants adjacent the plurality of second gate structures.

According to some embodiments, a method of semiconductor fabrication, comprises forming a first high voltage photoresist over a first transistor region of a substrate and a second transistor region of the substrate and patterning the first high voltage photoresist to form a high voltage photoresist over the first transistor region and a plurality of high voltage residual photoresists over the second transistor region, such that a plurality of high voltage implant areas of the substrate adjacent the plurality of high voltage residual photoresists are exposed. According to some embodiments, the method of semiconductor fabrication further comprises performing a high voltage LDD implant at a first high energy to implant a first high voltage dopant into the plurality of high voltage implant areas to form a plurality of high voltage shallow wells adjacent the plurality of high voltage residual photoresists and performing a high voltage pocket implant at a second high energy to implant a second high voltage dopant into the plurality of high voltage implant areas to form a plurality of high voltage pocket implants adjacent the plurality of high voltage residual photoresists.

According to some embodiments, a method of implanting a dopant, comprises depositing a photoresist over a gate structure, the gate structure being over a substrate, patterning the photoresist such that the photoresist is over some but not all of a top surface of the gate structure such that a photoresist width of the photoresist is less than a gate structure width of the gate structure and implanting, while the photoresist is over the gate structure, a first dopant into the substrate to form first doped regions in the substrate adjacent the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of semiconductor fabrication, comprising:
    forming a plurality of first transistors having a first operating voltage, the plurality of first transistors comprising a plurality of first gate structures over a first transistor region of a substrate, a plurality of low voltage shallow wells adjacent the plurality of first gate structures and a plurality of low voltage pocket implants adjacent the plurality of first gate structures; and
    forming a plurality of second transistors having a second operating voltage adjacent the plurality of first transistors, the forming a plurality of second transistors comprising:
        forming a first high voltage photoresist over the plurality of first gate structures, over the first transistor region and over a plurality of second gate structures, the plurality of second gate structures over a second transistor region of the substrate, such that a plurality of high voltage implant areas of the substrate adjacent the plurality of second gate structures are exposed and top surfaces of the plurality of second gate structures are partially exposed and partially covered by the first high voltage photoresist;
        performing, while the plurality of high voltage implant areas are exposed and while the top surfaces of the plurality of second gate structures are partially exposed, a high voltage LDD implant at a first high energy to implant a first high voltage dopant into the plurality of high voltage implant areas to form a plurality of high voltage shallow wells adjacent the plurality of second gate structures; and
        performing, while the plurality of high voltage implant areas are exposed and while the top surfaces of the plurality of second gate structures are partially exposed, a high voltage pocket implant at a second high energy to implant a second high voltage dopant into the plurality of high voltage implant areas to form a plurality of high voltage pocket implants adjacent the plurality of second gate structures.

2. The method of claim 1, the forming a plurality of first transistors, comprising:
    forming a low voltage photoresist over the second transistor region and over the plurality of second gate structures such that the plurality of first gate structures and a plurality of low voltage implant areas of the substrate adjacent the plurality of the first gate structures are exposed;
    performing a low voltage LDD implant at a first low energy to implant a first low voltage dopant into the plurality of low voltage implant areas to form the plurality of low voltage shallow wells; and
    performing a low voltage pocket implant at a second low energy to implant a second low voltage dopant into the plurality of low voltage implant areas to form the plurality of low voltage pocket implants.

3. The method of claim 1, comprising:
    forming a first layer of gate dielectric material over the substrate;
    removing the first layer of gate dielectric material from the first transistor region of the substrate such that a first portion of a high voltage gate dielectric remains over the second transistor region of the substrate;
    forming a second layer of gate dielectric material over the substrate and over the first portion of the high voltage gate dielectric such that a low voltage gate dielectric remains over the first transistor region of the substrate and the high voltage gate dielectric remains over the second transistor region of the substrate, where the high voltage gate dielectric comprises the first portion and a second portion from the second layer of gate dielectric material;

forming a layer of gate electrode material over the low voltage gate dielectric and over the high voltage gate dielectric; and patterning the layer of gate electrode material, the low voltage gate dielectric and the high voltage gate dielectric to concurrently form the plurality of first gate structures and the plurality of second gate structures.

4. The method of claim 1, comprising:
forming a layer of sidewall material over the plurality of first gate structures, the plurality of second gate structures and the substrate; and
patterning the layer of sidewall material to concurrently form a plurality of first sidewall spacers adjacent the plurality of first gate structures and a plurality of second sidewall spacers adjacent the plurality of second gate structures.

5. The method of claim 2, the performing a low voltage pocket implant comprising implanting a dose used in the semiconductor fabrication of devices with a selected voltage rating.

6. The method of claim 1, the plurality of first transistors a different type than the plurality of second transistors.

7. The method of claim 1, the performing a high voltage LDD implant comprising implanting at least one of boron, phosphorus, arsenic, antimony, boron, boron fluoride, nitrogen or carbon.

8. The method of claim 1, the performing a high voltage pocket implant comprising implanting at least one of boron, phosphorus, arsenic, antimony, boron, boron fluoride, nitrogen or carbon.

9. A method of semiconductor fabrication, comprising:
forming a first high voltage photoresist over a first transistor region of a substrate and a second transistor region of the substrate;
patterning the first high voltage photoresist to form a high voltage photoresist over the first transistor region and a plurality of high voltage residual photoresists over the second transistor region, the plurality of high voltage residual photoresists partially exposing top surfaces of a plurality of gate structures of transistors disposed within the second transistor region and partially covering the top surfaces of the plurality of gate structures of the transistors and the patterning comprising exposing, a plurality of high voltage implant areas of the substrate adjacent the plurality of high voltage residual photoresists;
performing, while the plurality of high voltage implant areas are exposed and while the to surfaces of the plurality of gate structures are partially exposed, a high voltage LDD implant at a first high energy to implant a first high voltage dopant into the plurality of high voltage implant areas to form a plurality of high voltage shallow wells adjacent the plurality of high voltage residual photoresists; and
performing, while the plurality of high voltage implant areas are exposed and while the to surfaces of the plurality of gate structures are partially exposed, a high voltage pocket implant at a second high energy to implant a second high voltage dopant into the plurality of high voltage implant areas to form a plurality of high voltage pocket implants adjacent the plurality of high voltage residual photoresists.

10. The method of claim 9, comprising:
forming a plurality of second gate structures in the first transistor region and the plurality of gate structures in the second transistor region;
forming a first low voltage photoresist over the plurality of second gate structures and the plurality of gate structures;
patterning the first low voltage photoresist to form a low voltage photoresist over the second transistor region and over the plurality of gate structures such that the plurality of second gate structures and a plurality of low voltage implant areas of the substrate adjacent the plurality of the second gate structures are exposed;
performing a low voltage LDD implant at a first low energy to implant a first low voltage dopant into the plurality of low voltage implant areas to form a plurality of low voltage shallow wells adjacent the plurality of second gate structures; and
performing a low voltage pocket implant at a second low energy to implant a second low voltage dopant into the plurality of low voltage implant areas to form a plurality of low voltage pocket implants adjacent the plurality of second gate structures.

11. The method of claim 10, comprising:
forming a first layer of gate dielectric material over the substrate;
removing the first layer of gate dielectric material from the first transistor region of the substrate such that a first portion of a high voltage gate dielectric remains over the second transistor region of the substrate;
forming a second layer of gate dielectric material over the substrate and over the first portion of the high voltage gate dielectric such that a low voltage gate dielectric remains over the first transistor region of the substrate and the high voltage gate dielectric remains over the second transistor region of the substrate, where the high voltage gate dielectric comprises the first portion and a second portion from the second layer of gate dielectric material;
forming a layer of gate electrode material over the low voltage gate dielectric and over the high voltage gate dielectric; and
patterning the layer of gate electrode material, the low voltage gate dielectric and the high voltage gate dielectric to concurrently form the plurality of gate structures and the plurality of second gate structures.

12. The method of claim 10, comprising:
forming a layer of sidewall material over the plurality of gate structures, the plurality of second gate structures and the substrate; and
patterning the layer of sidewall material to concurrently form a plurality of first sidewall spacers adjacent the plurality of gate structures and a plurality of second sidewall spacers adjacent the plurality of second gate structures.

13. The method of claim 10, the performing a low voltage pocket implant comprising implanting a dose used in the semiconductor fabrication of devices with a selected voltage rating.

14. The method of claim 10, the plurality of low voltage pocket implants a different type than the plurality of high voltage pocket implants.

15. The method of claim 9, at least one of:
the performing a high voltage LDD implant comprising implanting at least one of boron, phosphorus, arsenic, antimony, boron, boron fluoride, nitrogen or carbon; or the performing a high voltage pocket implant comprising implanting at least one of boron, phosphorus, arsenic, antimony, boron, boron fluoride, nitrogen or carbon.

16. The method of claim 9, at least one of:

the performing a high voltage LDD implant comprising implanting the first high voltage dopant at an angle that is substantially perpendicular to a surface of the substrate; or the performing a high voltage pocket implant comprising implanting the second high voltage dopant at the angle that is substantially perpendicular to the surface of the substrate.

17. A method of implanting a dopant, comprising:

depositing a photoresist over a gate structure, the gate structure over a substrate;

patterning the photoresist such that the photoresist is over some but not all of a top surface of the gate structure such that a photoresist width of the photoresist is less than a gate structure width of the gate structure;

implanting, while the photoresist is over the gate structure, a first dopant into the substrate to form first doped regions in the substrate adjacent the gate structure; and implanting, while the photoresist is over the gate structure, a second dopant into the substrate to form second doped regions in the substrate adjacent the gate structure.

18. The method of claim 17, at least one of:

the implanting a first dopant comprising implanting at least one of phosphorus, arsenic, boron, nitrogen, or carbon; or the implanting a second dopant comprising implanting at least one of phosphorus, arsenic, boron, nitrogen, or carbon.

19. The method of claim 17, the implanting a first dopant comprising implanting the first dopant at an angle that is substantially perpendicular to a top surface of the substrate.

20. The method of claim 17, comprising annealing the second dopant to drive the second dopant under the gate structure.

* * * * *